(12) United States Patent
Eguchi et al.

(10) Patent No.: US 11,171,190 B2
(45) Date of Patent: *Nov. 9, 2021

(54) SEMICONDUCTOR DEVICE, INPUT/OUTPUT DEVICE, AND ELECTRONIC APPLIANCE

(71) Applicant: Semiconductor Energy Laboratory Co., Ltd., Kanagawa-ken (JP)

(72) Inventors: Shingo Eguchi, Kanagawa (JP); Shunpei Yamazaki, Tokyo (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/845,517

(22) Filed: Apr. 10, 2020

(65) Prior Publication Data

US 2020/0243626 A1 Jul. 30, 2020

Related U.S. Application Data

(63) Continuation of application No. 15/861,945, filed on Jan. 4, 2018, now Pat. No. 10,622,426, which is a (Continued)

(30) Foreign Application Priority Data

May 2, 2014 (JP) ................................ 2014-095116

(51) Int. Cl.
*H01L 27/32* (2006.01)
*G06F 3/047* (2006.01)
(Continued)

(52) U.S. Cl.
CPC .......... *H01L 27/3253* (2013.01); *G06F 3/047* (2013.01); *G06F 3/0443* (2019.05);
(Continued)

(58) Field of Classification Search
None
See application file for complete search history.

(56) References Cited

U.S. PATENT DOCUMENTS 6,751,552 B1 6/2004 Minelli
7,816,856 B2 10/2010 Cok et al.
(Continued)

FOREIGN PATENT DOCUMENTS

CN 102334208 A 1/2012
EP 2 401 777 1/2012
(Continued)

*Primary Examiner* — Christopher R Lamb
(74) *Attorney, Agent, or Firm* — Husch Blackwell LLP

(57) ABSTRACT

A flexible input/output device and an input/output device having high resistance to repeated bending are provided. The input/output device includes a first flexible substrate, a first insulating layer over the first substrate, a first transistor over the first insulating layer, a light-emitting element over and electrically connected to the first transistor and including an EL layer between first and second electrodes, a first bonding layer over the light-emitting element, a sensing element and a second transistor over the first bonding layer and electrically connected to each other, a second insulating layer over the sensing element and the second transistor, and a second flexible substrate over the second insulating layer. In the input/output device, B/A is greater than or equal to 0.7 and less than or equal to 1.7, where A is a thickness between the EL layer and the first insulating layer and B is a thickness between the EL layer and the second insulating layer.

20 Claims, 17 Drawing Sheets

Related U.S. Application Data continuation of application No. 14/700,527, filed on Apr. 30, 2015, now Pat. No. 9,865,665.

(51) Int. Cl.
*H01L 51/52* (2006.01)
*G09G 5/00* (2006.01)
*G06F 3/044* (2006.01)

(52) U.S. Cl.
CPC .......... *G06F 3/0446* (2019.05); *G06F 3/0447* (2019.05); *G09G 5/003* (2013.01); *H01L 27/323* (2013.01); *H01L 27/3248* (2013.01); *H01L 51/524* (2013.01); *G06F 2203/04102* (2013.01); *G06F 2203/04103* (2013.01); *G09G 2300/0426* (2013.01); *H01L 2251/5338* (2013.01); *H01L 2251/558* (2013.01)

(56) References Cited

U.S. PATENT DOCUMENTS

| | | | |
|---|---|---|---|
| 8,243,027 | B2 | 8/2012 | Hotelling et al. |
| 8,415,208 | B2 | 4/2013 | Takayama et al. |
| 9,082,678 | B2 | 7/2015 | Yamazaki et al. |
| 9,184,211 | B2 | 11/2015 | Hirakata |
| 9,331,310 | B2 | 5/2016 | Chida et al. |
| 9,406,698 | B2 | 8/2016 | Yamazaki et al. |
| 9,406,725 | B2 | 8/2016 | Yamazaki et al. |
| 9,923,174 | B2 | 3/2018 | Chida et al. |
| 10,032,833 | B2 | 7/2018 | Yamazaki et al. |
| 10,074,703 | B2 | 9/2018 | Hirakata |
| 10,170,726 | B2 | 1/2019 | Yamazaki et al. |
| 10,510,992 | B2 | 12/2019 | Chida et al. |
| 2005/0112805 | A1 | 5/2005 | Goto et al. |
| 2005/0200292 | A1 | 9/2005 | Naugler et al. |
| 2006/0097991 | A1 | 5/2006 | Hotelling et al. |
| 2006/0132461 | A1 | 6/2006 | Furukawa et al. |
| 2007/0080627 | A1 | 4/2007 | Sakamoto |
| 2009/0046077 | A1 | 2/2009 | Tanaka et al. |
| 2009/0085891 | A1 | 4/2009 | Yang et al. |
| 2010/0213819 | A1 | 8/2010 | Cok et al. |
| 2012/0249454 | A1 | 10/2012 | Teraguchi et al. |
| 2013/0299789 | A1 | 11/2013 | Yamazaki et al. |
| 2014/0008668 | A1 | 1/2014 | Hirakata |
| 2014/0014960 | A1* | 1/2014 | Yamazaki ............ H01L 27/322 257/59 |
| 2014/0063364 | A1* | 3/2014 | Hirakata ............... G06F 1/1643 349/12 |
| 2014/0292686 | A1* | 10/2014 | Yamamoto ........... G06F 3/0446 345/173 |
| 2015/0144920 | A1 | 5/2015 | Yamazaki et al. |
| 2015/0228704 | A1 | 8/2015 | Miyake et al. |
| 2015/0255518 | A1 | 9/2015 | Watanabe et al. |
| 2015/0261333 | A1 | 9/2015 | Kaneyasu et al. |
| 2015/0301422 | A1 | 10/2015 | Miyake et al. |
| 2018/0342561 | A1 | 11/2018 | Yamazaki et al. |

FOREIGN PATENT DOCUMENTS

| | | |
|---|---|---|
| JP | 2003-174153 A | 6/2003 |
| JP | 2003-196023 A | 7/2003 |
| JP | 2009-003916 A | 1/2009 |
| JP | 2012-518892 | 8/2012 |
| JP | 2013-251255 A | 12/2013 |
| JP | 2014-029853 A | 2/2014 |
| JP | 2014-032960 A | 2/2014 |
| JP | 2014-063723 A | 4/2014 |
| KR | 2011-0134419 A | 12/2011 |
| KR | 2013-0125715 A | 11/2013 |
| KR | 2014-0005770 A | 1/2014 |
| TW | 201409753 | 3/2014 |
| WO | WO 2010/098992 A1 | 9/2010 |

* cited by examiner

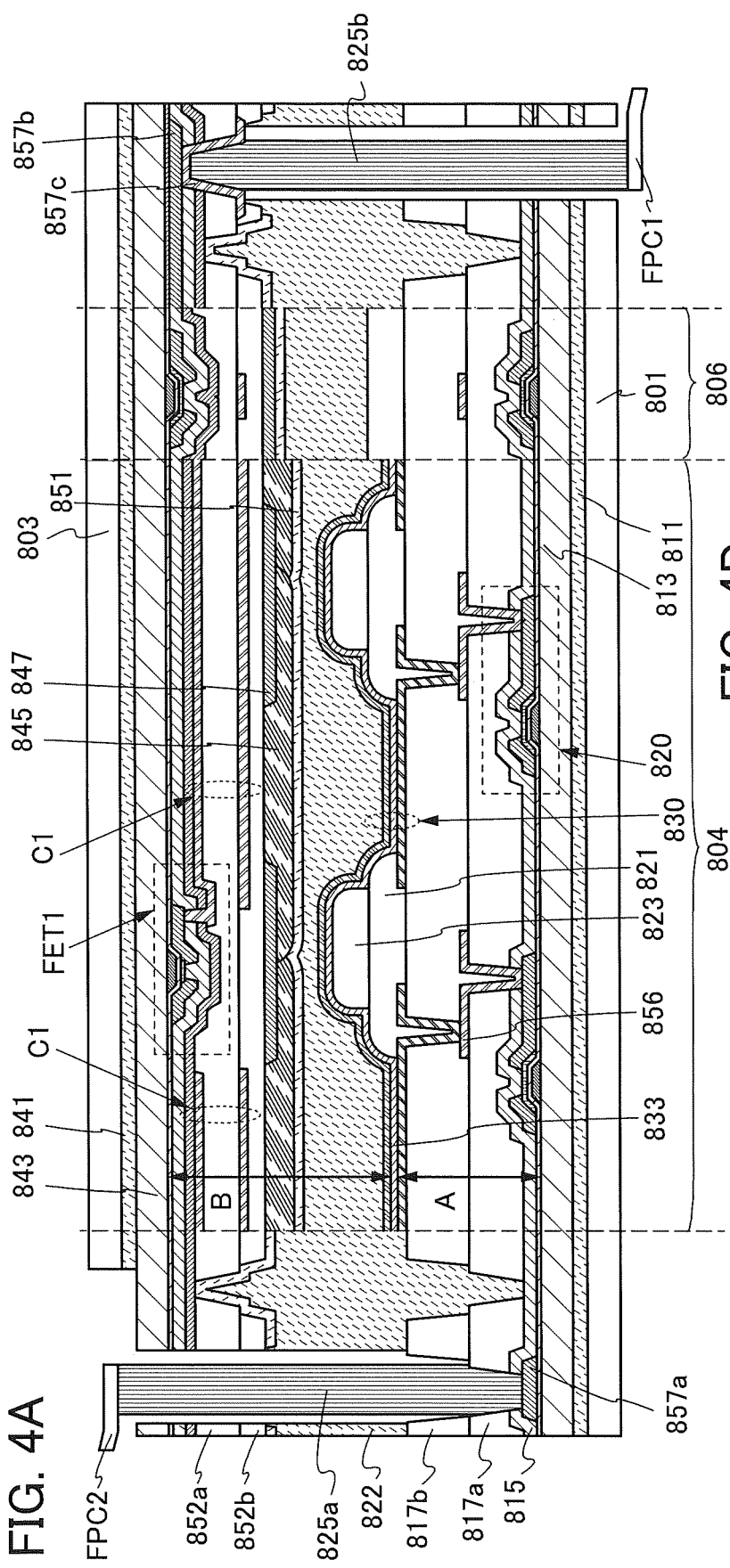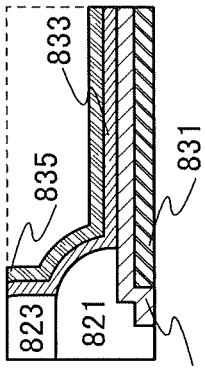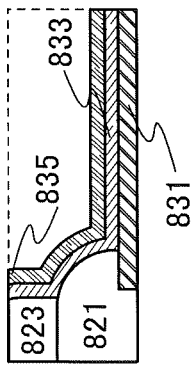

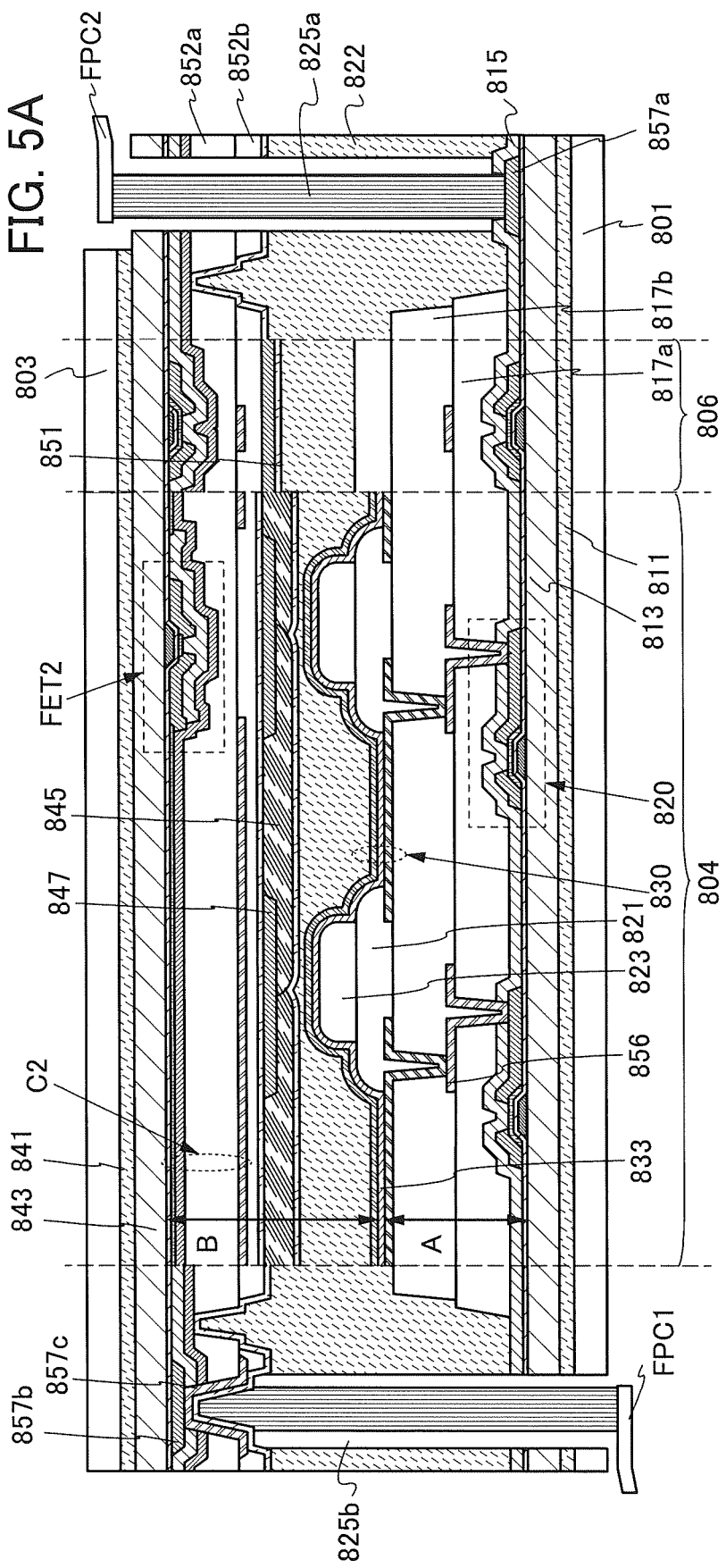

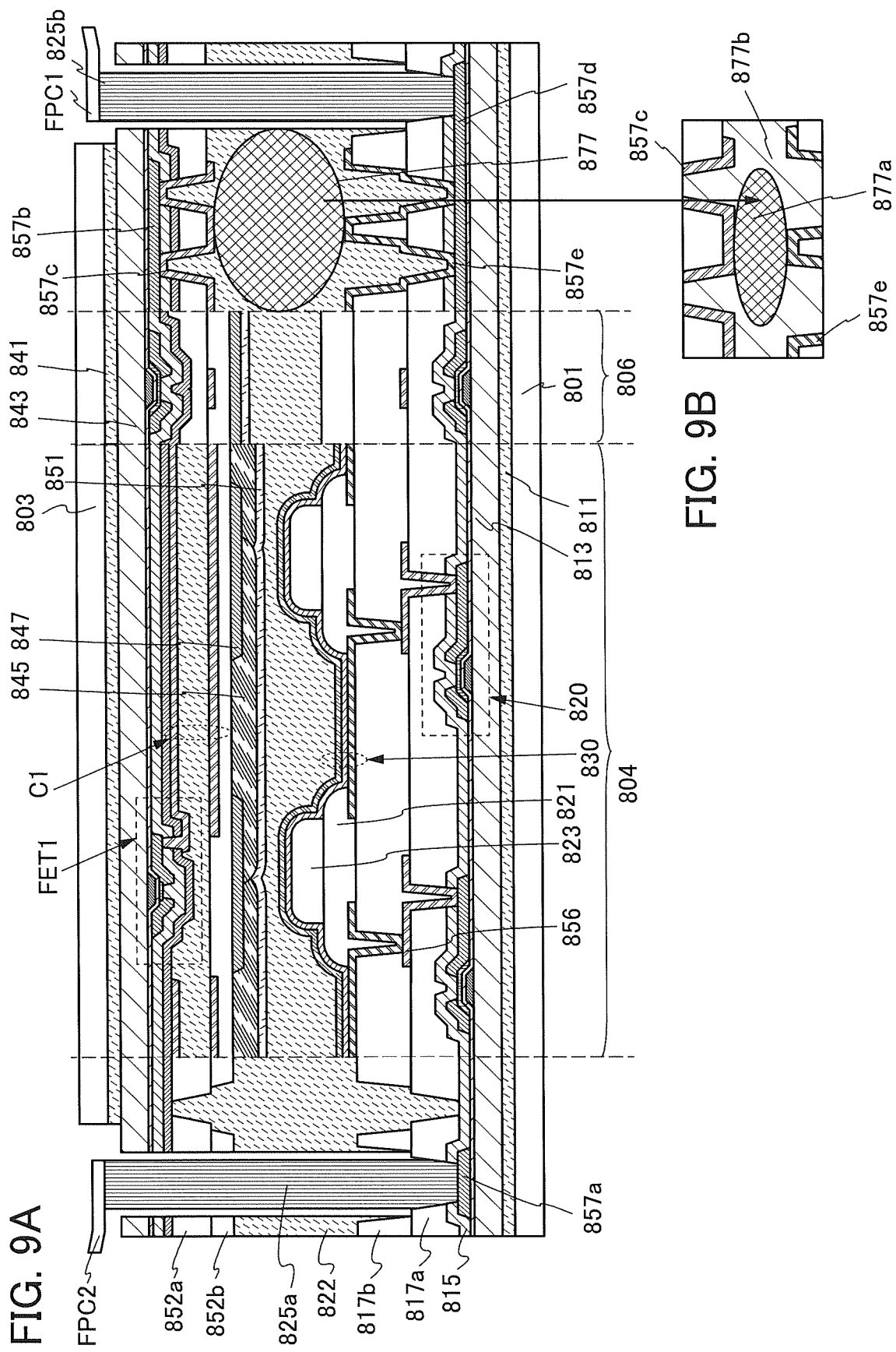

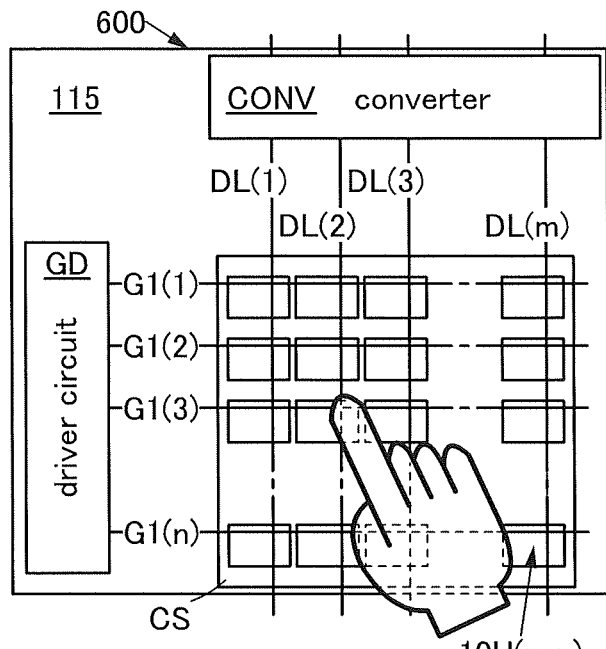
FIG. 10A
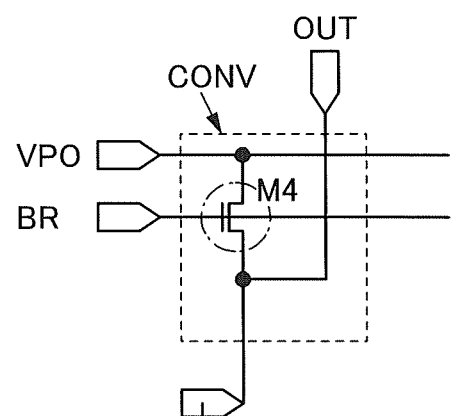
FIG. 10B
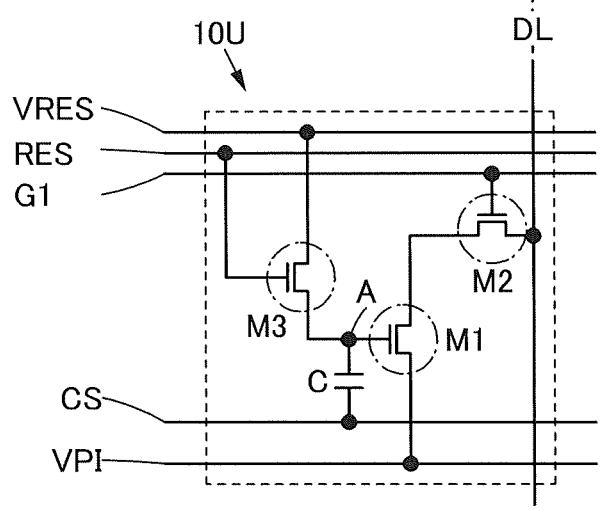
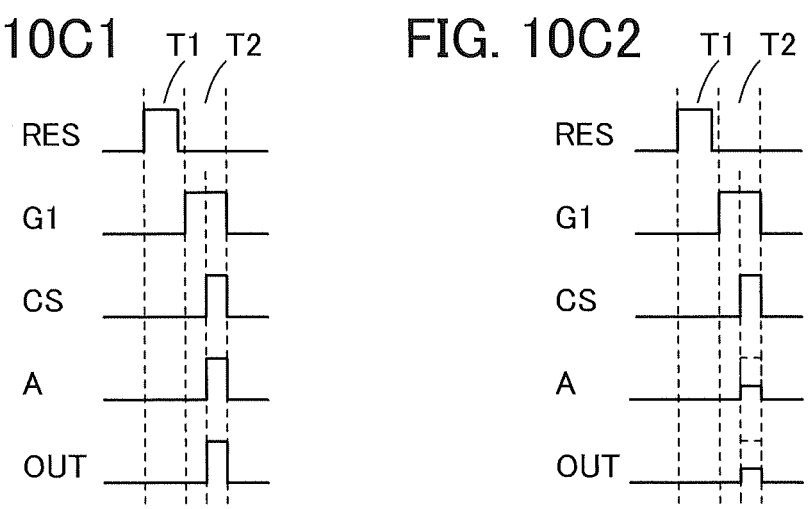
FIG. 10C1
FIG. 10C2

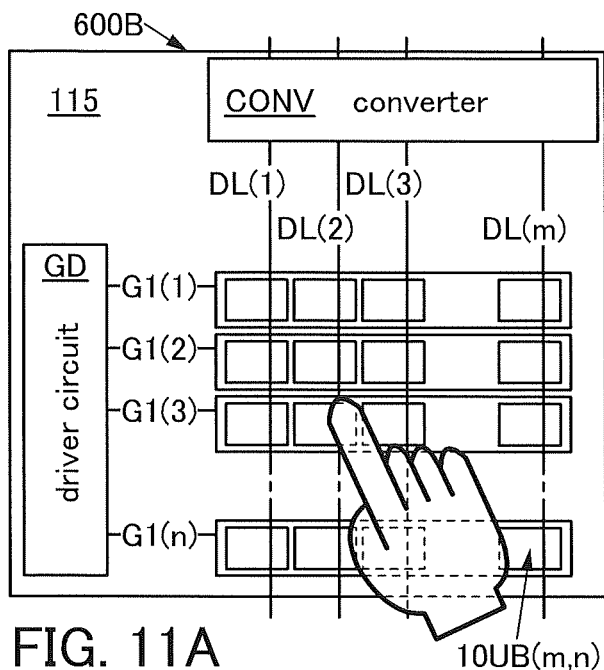
FIG. 11A
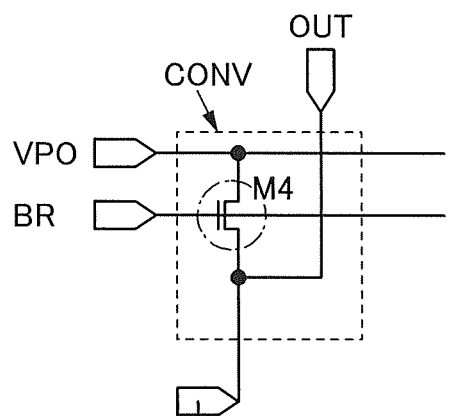
FIG. 11B
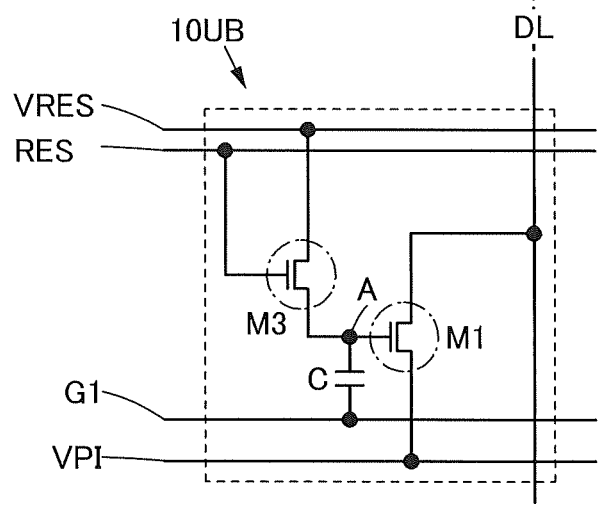
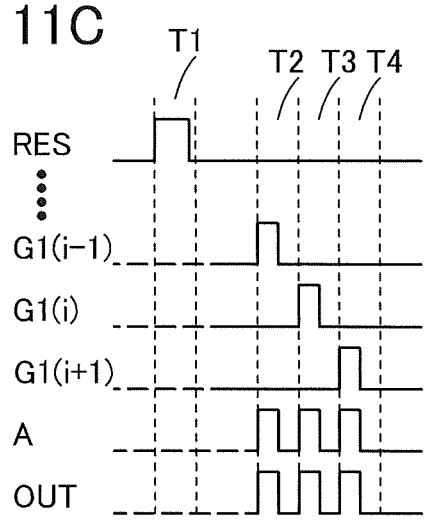
FIG. 11C

SEMICONDUCTOR DEVICE, INPUT/OUTPUT DEVICE, AND ELECTRONIC APPLIANCE

This application is a continuation of copending U.S. application Ser. No. 15/861,945, filed on Jan. 4, 2018 which is a continuation of U.S. application Ser. No. 14/700,527, filed on Apr. 30, 2015 (now U.S. Pat. No. 9,865,665 issued Jan. 9, 2018) which are all incorporated herein by reference.

BACKGROUND OF THE INVENTION

1. Field of the Invention

One embodiment of the present invention relates to an input/output device, and particularly to a flexible input/output device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an electronic appliance, a lighting device, an input device (e.g., a touch sensor), an output device, an input/output device (e.g., a touch panel), a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin-film solar cell and an organic thin-film solar cell), and an electronic appliance may each include a semiconductor device.

2. Description of the Related Art

Light-emitting elements utilizing electroluminescence (EL) (such elements are also referred to as EL elements) have features of the ease of being thinner and lighter, high speed response to input signals, and capability of DC low voltage driving and have been expected to be applied to display devices and lighting devices.

Furthermore, a flexible device in which a functional element such as a semiconductor element, a display element, or a light-emitting element is provided over a substrate having flexibility (hereinafter also referred to as flexible substrate) has been developed. Typical examples of the flexible device include a lighting device, an image display device, and a variety of semiconductor circuits including a semiconductor element such as a transistor.

Patent Document 1 discloses a flexible active matrix light-emitting device in which an organic EL element and a transistor serving as a switching element are provided over a film substrate.

Display devices are expected to be applied to a variety of uses and become diversified. For example, a smartphone and a tablet with a touch panel are being developed as portable information terminals.

REFERENCE

Patent Document 1: Japanese Published Patent Application No. 2003-174153

SUMMARY OF THE INVENTION

What is desirable is a flexible touch panel in which a flexible display panel is provided with a function of inputting data with a finger or the like touching a screen as a user interface.

An object of one embodiment of the present invention is to provide a flexible input/output device. Another object of one embodiment of the present invention is to provide a lightweight input/output device. Another object of one embodiment of the present invention is to provide a thin input/output device. Another object of one embodiment of the present invention is to provide an input/output device with high detection sensitivity. Another object of one embodiment of the present invention is to achieve both a reduction in thickness and high detection sensitivity of an input/output device. Another object of one embodiment of the present invention is to provide a large-sized input/output device.

Another object of one embodiment of the present invention is to manufacture an input/output device through a small number of steps. Another object of one embodiment of the present invention is to manufacture an input/output device with high yield.

Another object of one embodiment of the present invention is to provide a highly reliable input/output device. Another object of one embodiment of the present invention is to provide an input/output device with high resistance to repeated bending. Another object of one embodiment of the present invention is to provide a novel semiconductor device, a novel light-emitting device, a novel display device, a novel input/output device, a novel electronic appliance, or a novel lighting device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an input/output device that includes a first flexible substrate, a first insulating layer over the first substrate, a first transistor over the first insulating layer, a light-emitting element over the first transistor, a first bonding layer over the light-emitting element, a sensing element and a second transistor over the first bonding layer, a second insulating layer over the sensing element and the second transistor, and a second flexible substrate over the second insulating layer. The light-emitting element includes a first electrode, a second electrode, and a layer containing a light-emitting organic compound (also referred to as an EL layer) between the first electrode and the second electrode, and emits light toward the second substrate. The first transistor and the light-emitting element are electrically connected to each other. The second transistor and the sensing element are electrically connected to each other. In a light-emitting region of a pixel, B/A is greater than or equal to 0.7 and less than or equal to 1.7, where A is a thickness between the EL layer and the first insulating layer and B is a thickness between the EL layer and the second insulating layer.

Note that in this specification and the like, the expression "Component Y over Component X" is not limited to the case where Component X and Component Y overlap each other. Component X and Component Y may not overlap each other, or Component X and Component Y may at least partly overlap each other.

One embodiment of the present invention is an input/output device that includes a first flexible substrate, a first insulating layer over the first substrate, a first transistor over the first insulating layer, a light-emitting element over the first transistor, a first bonding layer over the light-emitting element, a sensing element and a second transistor over the first bonding layer, a second insulating layer over the sensing element and the second transistor, and a second flexible substrate over the second insulating layer. The light-emitting element includes a first electrode, a second electrode, and a first layer. The first layer contains a light-emitting organic compound and is positioned between the first electrode and the second electrode. The light-emitting element has a function of emitting light toward the second substrate. The first transistor and the light-emitting element are electrically connected to each other. The second transistor and the sensing element are electrically connected to each other. A light-emitting region of a pixel includes a region where a thickness between the first layer and the first insulating layer is A and a region where a thickness between the first layer and the second insulating layer is B, and B/A is greater than or equal to 0.7 and less than or equal to 1.7.

The thickness of the input/output device with each of the above-described structures is preferably greater than or equal to 10 µm and less than or equal to 100 µm. Alternatively, for example, the input/output device of one embodiment of the present invention preferably includes a region with a thickness of greater than or equal to 10 µm and less than or equal to 100 µm.

In each of the above-described structures, the thickness of the first bonding layer is preferably greater than or equal to 50 nm and less than or equal to 10 µm. Alternatively, for example, the first bonding layer in the input/output device of one embodiment of the present invention preferably includes a region with a thickness of greater than or equal to 50 nm and less than or equal to 10 µm.

In each of the above-described structures, a first conductive layer is preferably provided over the first insulating layer; the sensing element preferably includes a pair of electrodes and a third insulating layer between the pair of electrodes; and one of the pair of electrodes and the first conductive layer are preferably electrically connected to each other through a conductive connector.

In each of the above-described structures, a second bonding layer is preferably provided between the first substrate and the first insulating layer, and the thickness of the second bonding layer is preferably greater than or equal to 50 nm and less than or equal to 10 µm. Alternatively, for example, the second bonding layer in the input/output device of one embodiment of the present invention preferably includes a region with a thickness of greater than or equal to 50 nm and less than or equal to 10 µm.

In each of the above-described structures, a third bonding layer is preferably provided between the second substrate and the second insulating layer, and the thickness of the third bonding layer is preferably greater than or equal to 50 nm and less than or equal to 10 µm. Alternatively, for example, the third bonding layer in the input/output device of one embodiment of the present invention preferably includes a region with a thickness of greater than or equal to 50 nm and less than or equal to 10 µm.

In each of the above-described structures, a fourth frame-like bonding layer that surrounds the first bonding layer is preferably provided.

In each of the above-described structures, at least part of an edge of the second bonding layer is preferably positioned outside an edge of the first substrate.

In each of the above-described structures, at least part of an edge of the third bonding layer is preferably positioned outside an edge of the second substrate.

Note that the input/output device of one embodiment of the present invention in this specification and the like may include, in its category, modules such as a module provided with a connector such as a flexible printed circuit (FPC) or a tape carrier package (TCP) and a module directly mounted with an integrated circuit (IC) by a chip on glass (COG) method or the like. Alternatively, these modules may include, in its category, the input/output device of one embodiment of the present invention.

According to one embodiment of the present invention, a flexible input/output device can be provided. According to one embodiment of the present invention, a lightweight input/output device can be provided. According to one embodiment of the present invention, a thin input/output device can be provided. According to one embodiment of the present invention, an input/output device with high detection sensitivity can be provided. According to one embodiment of the present invention, both a reduction in thickness and high detection sensitivity of an input/output device can be achieved. According to one embodiment of the present invention, a large-sized input/output device can be provided.

According to one embodiment of the present invention, an input/output device can be manufactured through a small number of steps. According to one embodiment of the present invention, an input/output device can be manufactured with high yield.

According to one embodiment of the present invention, a highly reliable input/output device can be provided. According to one embodiment of the present invention, an input/output device with high resistance to repeated bending can be provided. According to one embodiment of the present invention, a novel semiconductor device, a novel light-emitting device, a novel display device, a novel input/output device, a novel electronic appliance, or a novel lighting device can be provided.

Note that the description of these effects does not disturb the existence of other effects. One embodiment of the present invention does not necessarily have all the effects. Other effects will be apparent from and can be derived from the description of the specification, the drawings, the claims, and the like.

BRIEF DESCRIPTION OF THE DRAWINGS

FIGS. 4A to 4D illustrate an example of an input/output device.

FIGS. 5A and 5B illustrate an example of an input/output device.

FIGS. 9A and 9B illustrate an example of an input/output device.

FIGS. 10A, 10B, 10C1, and 10C2 illustrate examples of structures of an input device, a sensing unit, and a converter and an example of a method for driving the sensing unit.

FIGS. 11A to 11C illustrate examples of structures of an input device, a sensing unit, and a converter and an example of a method for driving the sensing unit.

DETAILED DESCRIPTION OF THE INVENTION

Figure 1A:
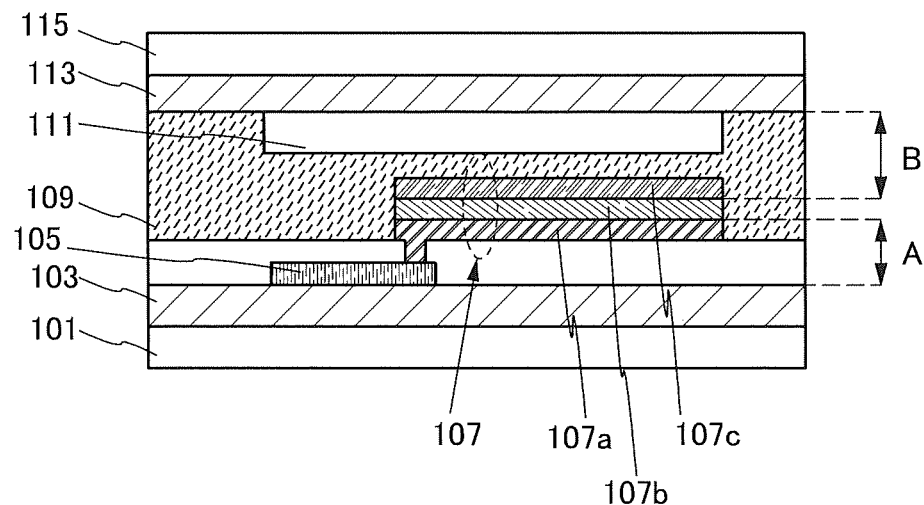
FIGS. 1A and 1B each illustrate an example of an input/output device.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the invention should not be construed as being limited to the description in the following embodiments.

Note that in the structures of the invention described below, the same portions or portions having similar functions are denoted by the same reference numerals in different drawings, and description of such portions is not repeated. In some cases, the same hatching pattern is used for portions having similar functions, and the portions are not denoted by reference numerals.

The position, size, range, or the like of each structure illustrated in drawings and the like is not accurately represented in some cases for easy understanding. Therefore, the disclosed invention is not necessarily limited to the position, size, range, or the like disclosed in the drawings and the like.

Note that the terms "film" and "layer" can be interchanged with each other depending on circumstances or situations. For example, in some cases, the term "conductive film" can be used instead of the term "conductive layer", and the term "insulating layer" can be used instead of the term "insulating film".

Embodiment 1

In this embodiment, an input/output device of one embodiment of the present invention is described.

The input/output device of one embodiment of the present invention includes a display portion and an input portion. Although the case where an organic EL element is used in the display portion and a capacitive touch sensor is used in the input portion is described, one embodiment of the present invention is not limited thereto. A light-emitting element other than the organic EL element or a display element may be used in the display portion. A sensing element other than a capacitor may be used in the input portion.

Examples of the capacitive touch sensor are a surface capacitive touch sensor and a projected capacitive touch sensor. Examples of the projected capacitive touch sensor are a self-capacitive touch sensor and a mutual capacitive touch sensor. The use of a mutual capacitive type is preferable because multiple points can be sensed simultaneously.

FIG. 1A is a schematic cross-sectional view of an input/output device of one embodiment of the present invention. The input/output device illustrated in FIG. 1A includes a first flexible substrate 101, a first insulating layer 103 over the first substrate 101, a first transistor 105 over the first insulating layer 103, a light-emitting element 107 over the first transistor 105, a first bonding layer 109 over the light-emitting element 107, a sensing element and a second transistor, which are collectively illustrated as an element layer 111, over the first bonding layer 109, a second insulating layer 113 over the sensing element and the second transistor, and a second flexible substrate 115 over the second insulating layer 113. The light-emitting element 107 includes a first electrode 107a, a second electrode 107c, and an EL layer 107b between the first electrode 107a and the second electrode 107c. The light-emitting element 107 emits light toward the second substrate 115. The first transistor 105 and the light-emitting element 107 are electrically connected to each other. The second transistor and the sensing element are electrically connected to each other. In a light-emitting region of a pixel, B/A is greater than or equal to 0.7 and less than or equal to 1.7, where A is a thickness between the EL layer 107b and the first insulating layer 103 and B is a thickness between the EL layer 107b and the second insulating layer 113. Here, the thickness A does not include the thicknesses of the EL layer 107b and the first insulating layer 103. Similarly, the thickness B does not include the thicknesses of the EL layer 107b and the second insulating layer 113.

Since the light-emitting element and the sensing element are provided between the pair of flexible substrates in one embodiment of the present invention, a flexible input/output device can be achieved. In addition, the weight and thickness of the input/output device can be reduced.

In the laminated structure included in the input/output device, the adhesion especially between the EL layer and the electrode is low or the adhesion between layers included in the EL layer is low in some cases. In such a case, the EL layer is partly separated when the flexible input/output device is bent, resulting in poor light emission.

In the light-emitting region of the pixel in the input/output device of one embodiment of the present invention, B/A is greater than or equal to 0.7 and less than or equal to 1.7, where A is a thickness between the EL layer and the first insulating layer and B is a thickness between the EL layer and the second insulating layer. With such a structure, a neutral plane where distortion due to stress such as compressive stress or tensile stress against deformation such as bending does not occur (a plane that does not expand or contract) is positioned in the EL layer or near the EL layer. Thus, separation of the EL layer due to bending or the like can be inhibited, so that the input/output device can be highly reliable. Moreover, the input/output device can have high resistance to repeated bending.

In terms of reduction in thickness and weight, improvement in flexibility, or the like, the thickness of the input/output device of one embodiment of the present invention is, for example, preferably less than or equal to 1 mm, further preferably less than or equal to 500 µm, still further preferably less than or equal to 300 µm, particularly preferably less than or equal to 100 µm. In addition, in terms of mechanical strength or the like, the thickness of the input/output device of one embodiment of the present invention is, for example, preferably greater than or equal to 1 μm, further preferably greater than or equal to 5 μm, still further preferably greater than or equal to 10 μm. The thickness of the input/output device of one embodiment of the present invention is, for example, preferably greater than or equal to 10 μm and less than or equal to 100 μm. This can inhibit breakage of the element or the like due to stress in bending, so that the input/output device can have high resistance to repeated bending.

Furthermore, in terms of reduction in thickness and weight, improvement in flexibility, or the like, the thickness of the first bonding layer is, for example, preferably greater than or equal to 50 nm and less than or equal to 10 μm, further preferably greater than or equal to 50 nm and less than or equal to 5 μm, still further preferably greater than or equal to 50 nm and less than or equal to 3 μm.

In one embodiment of the present invention, the light-emitting element, a color filter, and a microresonator (a microcavity structure) are preferably combined in order to maintain high color reproducibility or to extract light with high color purity and achieve high-definition display. By providing the color filter so as to overlap with the light-emitting element, the color purity of light from a pixel can be increased. In addition, by providing a light-blocking layer between two adjacent color filters, mixture of light emitted from two adjacent pixels can be inhibited, resulting in high display quality.

When a viewer looks at display of the input/output device having the microcavity structure and the viewer's eyes are perpendicular to a panel plane, the viewer can recognize high-intensity light of a desired color. On the other hand, as the viewer's eyes deviate from the position perpendicular to the display plane, it becomes more difficult for the viewer to recognize light of the desired color. Furthermore, as the distance from the light-emitting element to the color filter increases, the viewing angle dependence increases. Thus, in the case where the first bonding layer is provided between the light-emitting element and the color filter, the thickness of the first bonding layer is preferably small and preferably falls within any of the above-described ranges also in terms of reduction in viewing angle dependence.

The first substrate and the second substrate preferably have the same thickness or substantially the same thickness. When the first substrate and the second substrate have the same thickness, the transistor and the sensing element as well as the light-emitting element can be positioned in the central part of the input/output device. As a result, breakage of the element or the like due to stress in bending can be inhibited, so that the input/output device can have high resistance to repeated bending. The ratio of the thickness of the second substrate to the thickness of the first substrate is, for example, less than or equal to ±20%, preferably less than or equal to ±10%, further preferably less than or equal to ±5%.

In terms of reduction in thickness and weight, improvement in flexibility, or the like, the thickness of each of the first substrate and the second substrate is, for example, preferably less than or equal to 500 μm, further preferably less than or equal to 200 μm, still further preferably less than or equal to 100 μm, still further preferably less than or equal to 50 μm, particularly preferably less than or equal to 25 μm. In addition, in terms of mechanical strength or the like, the thickness of each of the first substrate and the second substrate is, for example, preferably greater than or equal to 1 μm, further preferably greater than or equal to 5 μm, still further preferably less than or equal to 10 μm. The thickness of each of the first substrate and the second substrate is, for example, preferably greater than or equal to 10 μm and less than or equal to 50 μm. This can inhibit breakage of the element or the like due to stress in bending, so that the input/output device can have high resistance to repeated bending.

The linear thermal expansion coefficients of materials for the first substrate and the second substrate are preferably the same or substantially the same. When the materials have the same linear thermal expansion coefficient, unintentional curve or curl of the input/output device can be inhibited even when heat in a manufacturing process or temperature in use of the device is changed. In addition, the range of guaranteed operating temperature can be expanded. The difference between the linear thermal expansion coefficient of the material for the first substrate and that of the material for the second substrate at temperatures, for example, from 0° C. to 200° C. is preferably 10 ppm/K or less, further preferably 5 ppm/K or less, still further preferably 2 ppm/K or less.

Figure 1B:
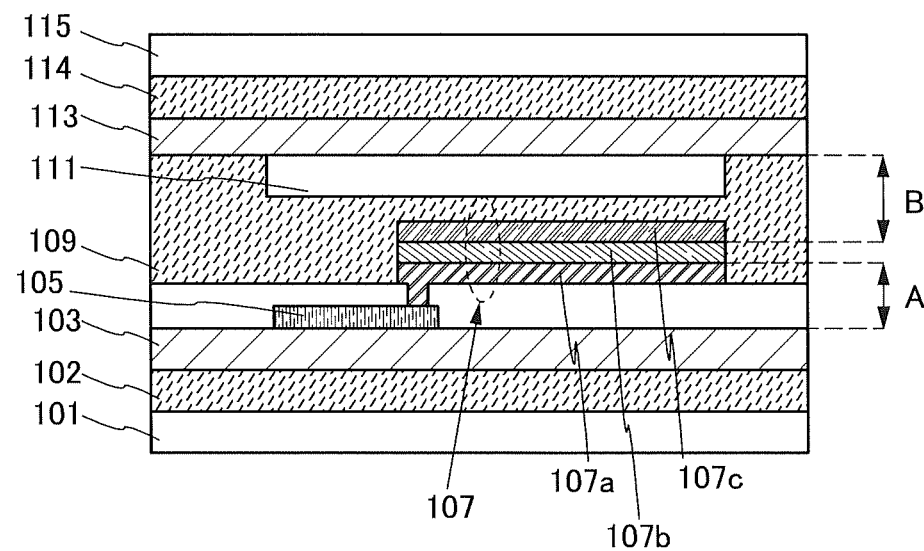

FIG. 1B is a schematic cross-sectional view of an input/output device of one embodiment of the present invention. The input/output device illustrated in FIG. 1B differs from the input/output device illustrated in FIG. 1A in that a second bonding layer 102 is provided between the first substrate 101 and the first insulating layer 103 and that a third bonding layer 114 is provided between the second substrate 115 and the second insulating layer 113.

A layer to be separated can be formed over a formation substrate, separated from the formation substrate, and then transferred to another substrate. With this method, for example, a layer to be separated that is formed over a formation substrate having high heat resistance can be transferred to a substrate having low heat resistance. Thus, the formation temperature of the layer to be separated is not limited by the substrate having low heat resistance. Moreover, the layer to be separated can be transferred to a substrate or the like that is more lightweight or flexible or thinner than the formation substrate, whereby reduction in thickness and weight and improvement in flexibility of the input/output device can be achieved.

The input/output device of one embodiment of the present invention can be manufactured as described below, for example. First, the first insulating layer, the first transistor, the light-emitting element, and the like are formed over a first formation substrate. In addition, the second insulating layer, the second transistor, the sensing element, and the like are formed over a second formation substrate. Then, the pair of formation substrates are attached to each other with the first bonding layer. After that, the first formation substrate is separated, and the first substrate and the first insulating layer are attached to each other with the second bonding layer. In addition, the second formation substrate is separated, and the second substrate and the second insulating layer are attached to each other with the third bonding layer.

A transistor and the like are formed over a formation substrate having high heat resistance, whereby a highly reliable transistor and an insulating film with a sufficiently high moisture-resistant property can be formed at high temperature. Then, the transistor and the insulating film are transferred to a substrate having low heat resistance, whereby a highly reliable input/output device can be manufactured. Thus, in one embodiment of the present invention, a thin or lightweight input/output device with high reliability can be provided.

In terms of reduction in thickness and weight, improvement in flexibility, or the like, the thickness of each of the second bonding layer and the third bonding layer is preferably greater than or equal to 50 nm and less than or equal to 10 µm, further preferably greater than or equal to 50 nm and less than or equal to 5 µm, still further preferably greater than or equal to 50 nm and less than or equal to 3 µm.

The input/output device of one embodiment of the present invention has a structure in which the substrate supporting the sensing element and the substrate supporting the light-emitting element are positioned facing each other. In addition, an active matrix touch sensor including both a capacitor that is a sensing element and an active element such as a transistor is used. This structure allows the touch sensor to be less likely to be affected by noise caused when the light-emitting element is driven. Thus, a reduction in detection sensitivity can be inhibited even when the touch sensor and the light-emitting element are interposed between the two substrates and positioned close to each other.

The input/output device of one embodiment of the present invention is described in detail below.

Figure 2:
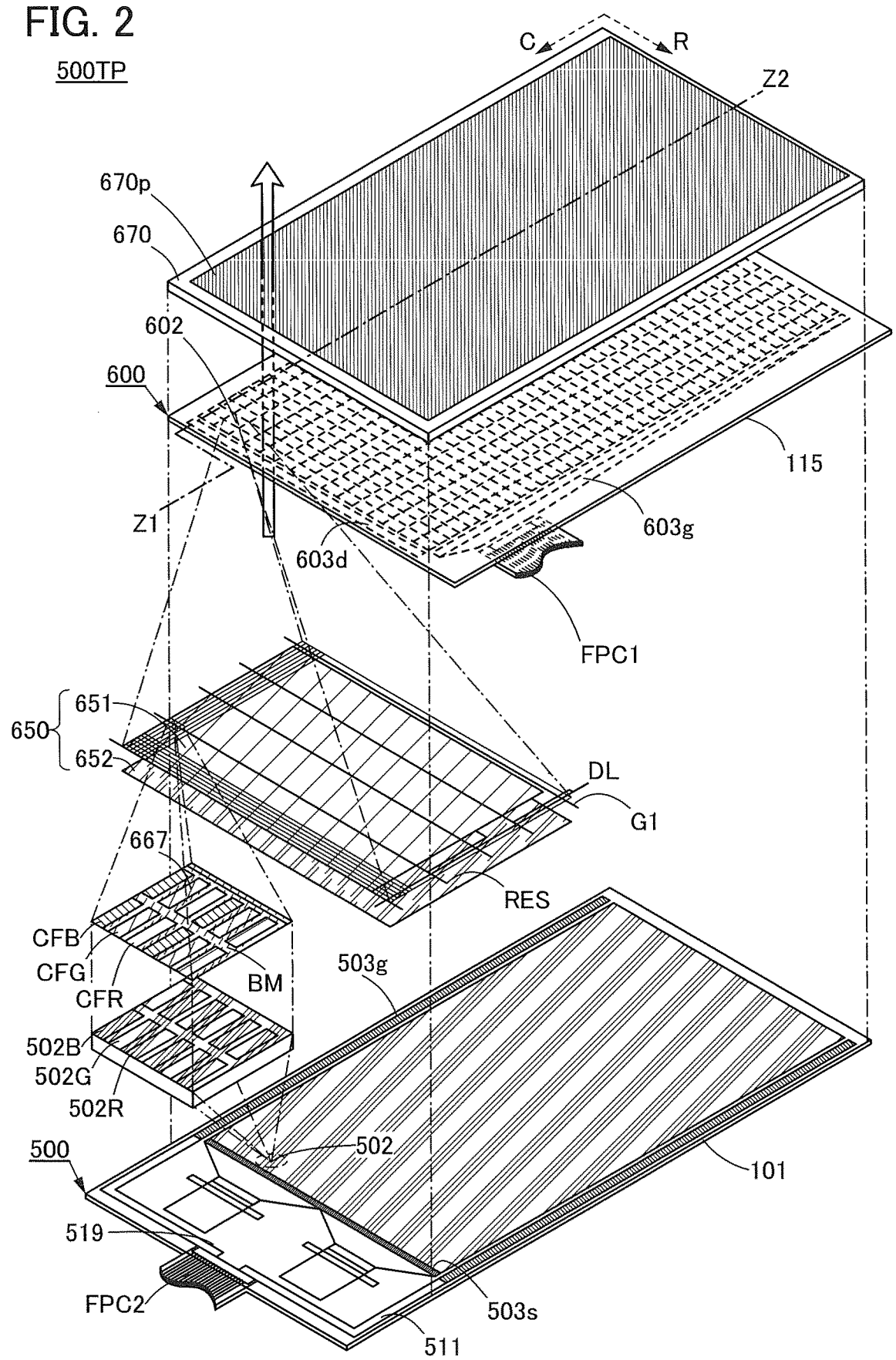
FIG. 2 illustrates an example of an input/output device.

FIG. 2 is a projection view illustrating a structure of an input/output device 500TP. Note that part of a sensing unit 602 and part of a pixel 502 are enlarged for convenience of explanation.

Figure 3A:
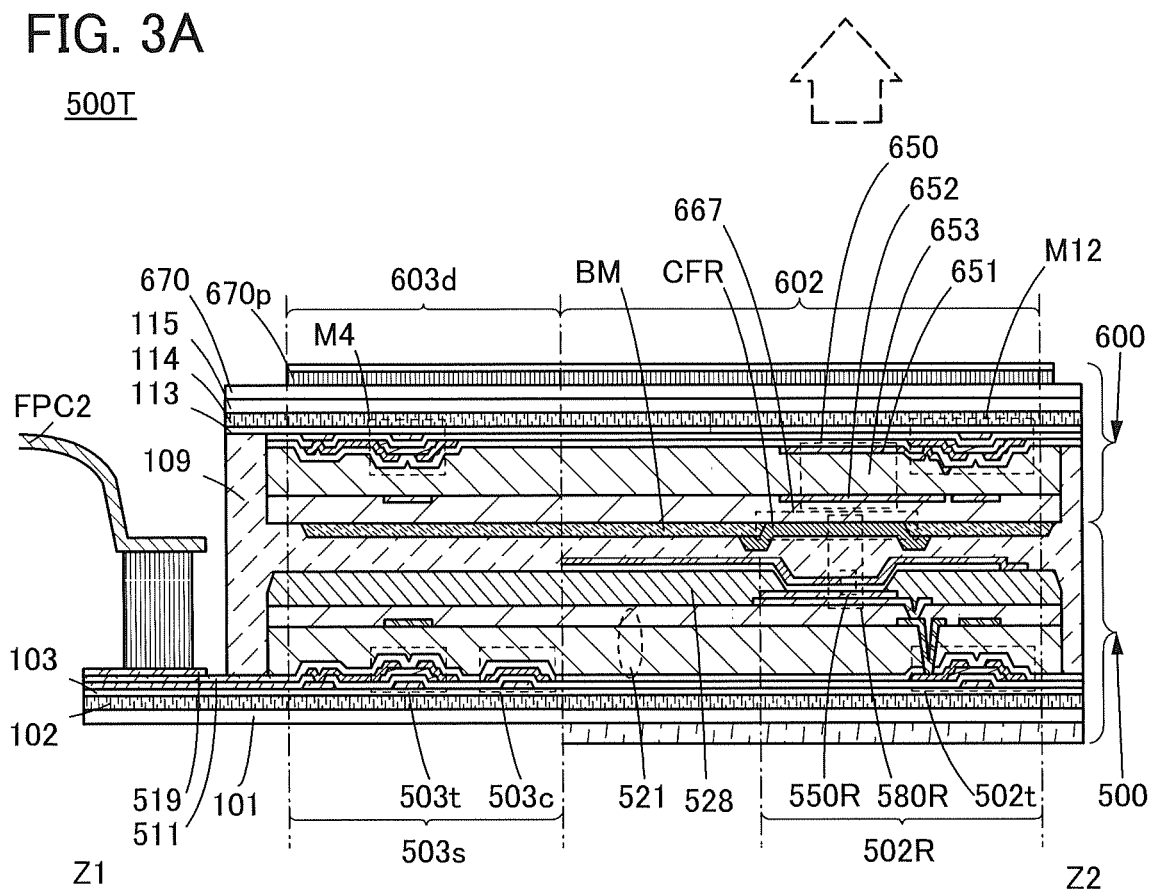
FIGS. 3A to 3C each illustrate an example of an input/output device.
Figure 3B:
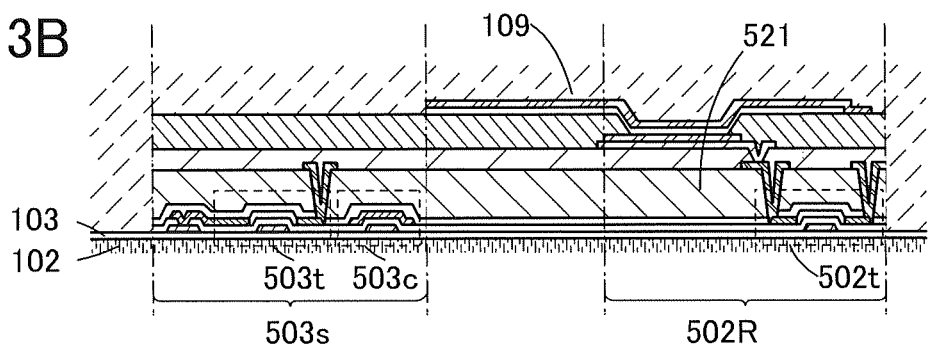
Figure 3C:
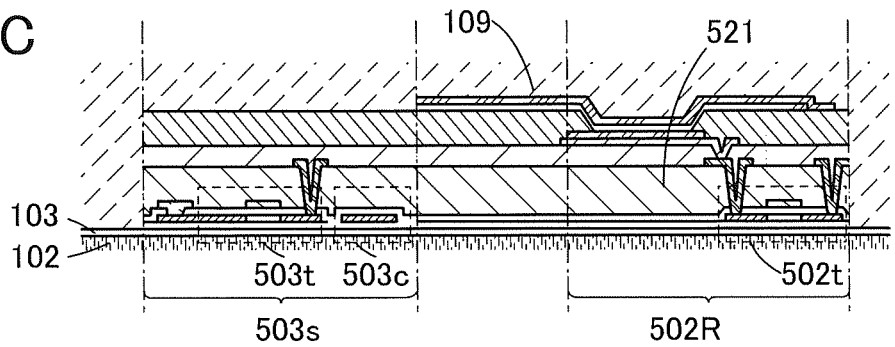

FIG. 3A is a cross-sectional view illustrating a structure of the input/output device 500TP taken along Z1-Z2 in FIG. 2. FIGS. 3B and 3C are cross-sectional views each illustrating an example in which the structure illustrated in FIG. 3A is partly changed.

<Structure Example of Input/output Device>

As illustrated in FIG. 2, the input/output device 500TP includes a display portion 500 and an input portion 600 that overlap each other.

The input portion 600 includes a plurality of sensing units 602 arranged in a matrix.

The input portion 600 also includes a selection signal line G1, a control line RES, and the like to which the plurality of sensing units 602 that are arranged in the row direction (indicated by the arrow R in the drawing) are electrically connected.

The input portion 600 also includes a signal line DL or the like to which the plurality of sensing units 602 that are arranged in the column direction (indicated by the arrow C in the drawing) are electrically connected.

The sensing unit 602 includes a sensing circuit. The sensing circuit is electrically connected to the selection signal line G1, the control line RES, the signal line DL, and the like.

A transistor, a sensing element, and/or the like can be used for the sensing circuit. For example, a conductive film and a capacitor electrically connected to the conductive film can be used for the sensing circuit. In addition, a capacitor and a transistor electrically connected to the capacitor can be used for the sensing circuit.

For the sensing circuit, for example, a capacitor 650 that includes an insulating layer 653 and a first electrode 651 and a second electrode 652 between which the insulating layer 653 is interposed can be used (see FIG. 3A).

The sensing unit includes a plurality of window portions 667 arranged in a matrix. The window portion 667 transmits visible light, and a light-blocking layer BM may be provided between the plurality of window portions 667.

A coloring layer is provided in a position overlapping with the window portion 667. The coloring layer transmits light of a predetermined color. Note that the coloring layer can be called a color filter. For example, a coloring layer CFB transmitting blue light, a coloring layer CFG transmitting green light, and a coloring layer CFR transmitting red light can be used. A coloring layer transmitting yellow light or a coloring layer transmitting white light may also be used.

The display portion 500 includes the plurality of pixels 502 arranged in a matrix. The pixel 502 is positioned so as to overlap with the window portions 667 of the input portion 600.

The pixels 502 may be arranged at higher density than the sensing units 602.

The input/output device 500TP described in this embodiment includes the input portion 600 that includes the plurality of sensing units 602 arranged in a matrix and provided with the window portions 667 transmitting visible light, the display portion 500 that includes the plurality of pixels 502 overlapping with the window portions 667, and the coloring layers between the window portions 667 and the pixels 502. In addition, each sensing unit is provided with a switch with which interference with another sensing unit can be reduced.

With such a structure, sensing data sensed by each sensing unit can be supplied together with the positional data of the sensing unit. In addition, the sensing data associated with the positional data of the pixel for displaying an image can be supplied. Electrical continuity between a sensing unit that does not supply sensing data and the signal line is not established, whereby interference with a sensing unit that supplies a sensing signal can be reduced. Consequently, the novel input/output device 500TP that is highly convenient or highly reliable can be provided.

For example, the input portion 600 of the input/output device 500TP can sense sensing data and supply the sensing data together with the positional data. Specifically, a user of the input/output device 500TP can make a variety of gestures (e.g., tap, drag, swipe, and pinch-in operation) using, as a pointer, his/her finger or the like on the input portion 600.

The input portion 600 can sense a finger or the like that approaches or touches the input portion 600 and supply sensing data including the sensed position, track, or the like.

An arithmetic unit determines whether or not supplied data satisfies a predetermined condition on the basis of a program or the like and executes an instruction associated with a predetermined gesture.

Thus, a user of the input portion 600 can make the predetermined gesture with his/her finger and make the arithmetic unit execute an instruction associated with the predetermined gesture.

For example, first, the input portion 600 of the input/output device 500TP selects one sensing unit X from the plurality of sensing units that can supply sensing data to one signal line. Then, electrical continuity between the sensing units other than the sensing unit X and the signal line is not established. This can reduce interference of the other sensing units with the sensing unit X.

Specifically, interference of sensing elements of the other sensing units with a sensing element of the sensing unit X can be reduced.

For example, in the case where a capacitor and a conductive film to which one electrode of the capacitor is electrically connected are used for the sensing element, interference of the potentials of the conductive films of the other sensing units with the potential of the conductive film of the sensing unit X can be reduced.

Thus, the input/output device 500TP can drive the sensing unit and supply sensing data independently of its size. The input/output device 500TP can have a variety of sizes, for example, ranging from a size for a hand-held device to a size for an electronic blackboard.

The input/output device 500TP can be folded and unfolded. Even in the case where interference of the other sensing units with the sensing unit X is different between the folded state and the unfolded state, the sensing unit can be driven and sensing data can be supplied without dependence on the state of the input/output device 500TP.

The display portion 500 of the input/output device 500TP can be supplied with display data. For example, the arithmetic unit can supply the display data.

In addition to the above structure, the input/output device 500TP can have the following structure.

The input portion 600 of the input/output device 500TP may include a driver circuit 603g or a driver circuit 603d. In addition, the input/output device 500TP may be electrically connected to an FPC1.

The display portion 500 of the input/output device 500TP may include a scan line driver circuit 503g, a signal line driver circuit 503s, a wiring 511, and a terminal 519. In addition, the display portion 500 may be electrically connected to an FPC2.

In addition, a protective layer 670 that prevents damage and protects the input/output device 500TP may be provided. For example, a ceramic coat layer or a hard coat layer can be used as the protective layer 670. Specifically, a layer containing aluminum oxide or an ultraviolet curable resin can be used. In addition, an anti-reflection layer 670p that weakens the intensity of external light reflected by the input/output device 500TP can be used. Specifically, a circularly polarizing plate or the like can be used.

Individual components included in the input/output device 500TP are described below. Note that these components cannot be clearly distinguished and one component also serves as another component or include part of another component in some cases.

For example, the input portion 600 provided with the coloring layers in positions overlapping with the plurality of window portions 667 also serves as a color filter.

Furthermore, for example, the input/output device 500TP in which the input portion 600 overlaps with the display portion 500 serves as the input portion 600 and the display portion 500. Note that the input/output device 500TP in which the input portion 600 overlaps with the display portion 500 is also referred to as a touch panel.

The input portion 600 includes the sensing unit 602, the selection signal line G1, the signal line DL, and the second substrate 115.

The sensing unit 602 senses an object that approaches or touches the sensing unit 602 and supplies a sensing signal. For example, the sensing unit 602 senses, for example, capacitance, illuminance, magnetic force, electric waves, or pressure and supplies data based on the sensed physical quantity. Specifically, a capacitor, a photoelectric conversion element, a magnetic sensing element, a piezoelectric element, a resonator, or the like can be used as the sensing element.

The sensing unit 602 senses, for example, a change in capacitance between the sensing unit 602 and an object that approaches or touches the sensing unit 602. Specifically, a conductive film and a sensing circuit electrically connected to the conductive film may be used.

Note that when an object having a dielectric constant higher than that of the air, such as a finger, comes close to a conductive film in the air, the capacitance between the finger and the conductive film changes. The sensing unit 602 can sense the capacitance change and supply sensing data. Specifically, a conductive film and a sensing circuit including a capacitor one electrode of which is connected to the conductive film can be used for the sensing unit 602.

For example, the capacitance change causes charge distribution, leading to voltage change across the capacitor. This voltage change can be used for a sensing signal. Specifically, the voltage between the electrodes of the capacitor 650 changes when an object comes close to the conductive film that is electrically connected to one electrode of the capacitor 650 (see FIG. 3A).

The sensing unit 602 includes a switch that can be turned on or off in accordance with a control signal. For example, a transistor M12 can be used as the switch.

In addition, a transistor that amplifies a sensing signal can be used for the sensing unit 602.

Transistors that can be manufactured through the same process can be used as the transistor that amplifies a sensing signal and the switch. This allows the input portion 600 to be manufactured through a simplified process.

The input portion 600 includes the selection signal line G1, the control line RES, the signal line DL, and the like. Each line can be formed using, for example, a conductive material such as an inorganic conductive material, an organic conductive material, a metal, or conductive ceramics.

The driver circuit 603g can supply selection signals at predetermined timings, for example. Specifically, the driver circuit 603g supplies selection signals to the selection signal lines G1 row by row in a predetermined order. Any of a variety of circuits can be used as the driver circuit 603g. For example, a shift register, a flip-flop circuit, a combination circuit, or the like can be used.

The driver circuit 603d supplies sensing data on the basis of a sensing signal supplied from the sensing unit 602. Any of a variety of circuits can be used as the driver circuit 603d. For example, a circuit that can form a source follower circuit or a current mirror circuit by being electrically connected to the sensing circuit in the sensing unit can be used as the driver circuit 603d. In addition, an analog-to-digital converter circuit that converts a sensing signal into a digital signal may be provided in the driver circuit 603d.

The FPC1 supplies a timing signal, a power supply potential, or the like and is supplied with a sensing signal.

The display portion 500 includes the pixels 502, the scan lines, the signal lines, and the first substrate 101 (see FIG. 2).

The pixel 502 includes a sub-pixel 502B, a sub-pixel 502G, and a sub-pixel 502R, and each sub-pixel includes a display element and a pixel circuit for driving the display element.

The pixel circuit includes, for example, a transistor 502t.

The display portion 500 includes an insulating film 521 that covers the transistor 502t. The insulating film 521 can be used as a layer for planarizing unevenness caused by the pixel circuits. A stacked film including a layer that can prevent diffusion of impurities can be used as the insulating film 521. This can inhibit reduction in the reliability of the transistor 502t or the like due to diffusion of impurities.

For example, organic EL elements that emit light of different colors may be used as display elements in sub-pixels. Alternatively, organic EL elements that emit white light may be used.

For example, a light-emitting element 550R includes a lower electrode, an upper electrode, and an EL layer between the lower electrode and the upper electrode.

The sub-pixel 502R includes a light-emitting module 580R. The sub-pixel 502R includes the light-emitting element 550R and a pixel circuit that can supply electric power to the light-emitting element 550R and includes a transistor 502t. The light-emitting module 580R includes the light-emitting element 550R and an optical element (e.g., the coloring layer CFR).

Note that a microcavity structure can be provided for the light-emitting module 580R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The light-emitting module 580R includes the coloring layer CFR on the light extraction side. The coloring layer transmits light with a specific wavelength and is, for example, a layer that selectively transmits light of red, green, blue, or the like. Note that other sub-pixels may be provided so as to overlap with the window portions, which are not provided with the coloring layers, so that light from the light-emitting element can be emitted without passing through the coloring layers.

The coloring layer CFR overlaps with the light-emitting element 550R. Accordingly, part of light emitted from the light-emitting element 550R passes through the coloring layer CFR and is emitted to the outside of the light-emitting module 580R as indicated by an arrow in FIG. 3A.

The light-blocking layer BM is located so as to surround the coloring layer (e.g., the coloring layer CFR).

In the case where the first bonding layer 109 is provided on the light extraction side, the first bonding layer 109 may be in contact with the light-emitting element 550R and the coloring layer CFR.

The lower electrode is provided over the insulating film 521. A partition wall 528 provided with an opening overlapping with the lower electrode is provided. Note that part of the partition wall 528 overlaps with an end portion of the lower electrode.

The lower electrode, the upper electrode, and the EL layer provided between the lower electrode and the upper electrode form the light-emitting element (e.g., the light-emitting element 550R). The pixel circuit supplies electric power to the light-emitting element.

In addition, a spacer that controls the gap between the first substrate 101 and the second substrate 115 is provided over the partition wall 528.

In the case of a transflective liquid crystal display or a reflective liquid crystal display, some of or all of pixel electrodes function as reflective electrodes. For example, some or all of pixel electrodes are formed to contain aluminum, silver, or the like.

A memory circuit such as an SRAM can be provided under the reflective electrodes, leading to lower power consumption. A structure suitable for employed display elements can be selected from among a variety of structures of pixel circuits.

The first substrate 101 and the second substrate 115 are attached to each other with the first bonding layer 109. The first bonding layer 109 has a refractive index higher than that of the air.

Note that the pixel circuit or the light-emitting element (e.g., the light-emitting element 550R) is positioned between the first substrate 101 and the second substrate 115.

The scan line driver circuit 503g supplies a selection signal. The signal line driver circuit 503s supplies an image signal. As illustrated in FIG. 3A, the signal line driver circuit 503s includes a transistor 503t and a capacitor 503c. Note that transistors used in the pixel circuit and the driver circuit can be formed through the same process and over the same substrate.

The display portion 500 includes wirings such as scan lines, signal lines, and power supply lines. Any of a variety of conductive films can be used for the wirings. For example, a conductive film similar to the conductive film that can be used for the input portion 600 can be used.

The display portion 500 includes a wiring 511 through which a signal can be supplied. The wiring 511 is provided with a terminal 519. Note that the FPC2 through which a signal such as an image signal or a synchronization signal can be supplied is electrically connected to the terminal 519.

Note that a printed wiring board (PWB) may be attached to the FPC2.

<Modification Example of Input/output Device>

Any of various kinds of transistors can be used in the input portion 600 and/or the display portion 500.

FIG. 3A illustrates a structure in which a bottom-gate transistor is used in the input portion 600.

FIGS. 3A and 3B each illustrate a structure in which a bottom-gate transistor is used in the display portion 500.

For example, a semiconductor layer containing an oxide semiconductor, amorphous silicon, or the like can be used in the transistor 502t and the transistor 503t illustrated in FIG. 3A.

For example, a semiconductor layer containing polycrystalline silicon that is obtained by crystallization process such as laser annealing can be used in the transistor 502t and the transistor 503t illustrated in FIG. 3B.

FIG. 3C illustrates a structure in which a top-gate transistor is used in the display portion 500.

For example, a semiconductor layer including a polycrystalline silicon film, a single crystal silicon film that is transferred from a single crystal silicon substrate, or the like can be used in the transistor 502t and the transistor 503t illustrated in FIG. 3C.

Specific examples of cross-sectional structures of the input/output device of one embodiment of the present invention are described in detail below.

<Specific Example 1 of Cross-sectional Structure>

FIG. 4A is an example of a cross-sectional view of the input/output device of one embodiment of the present invention. FIGS. 4B and 4C each illustrate an example of a structure of a light-emitting element. FIG. 4D is an enlarged view of a transistor FET1 and a sensing element C1.

The input/output device illustrated in FIG. 4A includes a substrate 801, a bonding layer 811, an insulating layer 813, a plurality of transistors, a conductive layer 857a, an insulating layer 815, an insulating layer 817a, an insulating layer 817b, a conductive layer 856, a plurality of light-emitting elements, an insulating layer 821, a bonding layer 822, a spacer 823, an overcoat 851, an insulating layer 852a, an insulating layer 852b, a coloring layer 845, a light-blocking layer 847, a conductive layer 857b, a conductive layer 857c, a plurality of sensing elements, an insulating layer 843, a bonding layer 841, and a substrate 803. The bonding layer 822, the overcoat 851, the insulating layer 852a, the insulating layer 852b, the insulating layer 843, the bonding layer 841, and the substrate 803 transmit visible light.

The substrate 801 corresponds to the first substrate 101 in FIG. 1B. The bonding layer 811, the insulating layer 813, the bonding layer 822, the insulating layer 843, the bonding layer 841, and the substrate 803 correspond to the second bonding layer 102, the first insulating layer 103, the first bonding layer 109, the second insulating layer 113, the third bonding layer 114, and the second substrate 115, respectively.

In FIG. 4A, light-emitting elements 830, transistors, and sensing elements C1 included in a light-emitting portion 804 and a driver circuit portion 806 are sealed with the substrate 801, the substrate 803, and the bonding layer 822.

The conductive layer 857*a* is electrically connected to an external input terminal through which a signal or a potential from the outside is transmitted to the driver circuit portion 806. In this example, the FPC2 is provided as the external input terminal. To prevent an increase in the number of manufacturing steps, the conductive layer 857*a* is preferably formed using the same material and steps as those of the electrode or the wiring in the light-emitting portion or the driver circuit portion. In this example, the conductive layer 857*a* is formed using the same material and steps as those of the electrode in the transistor 820. The FPC2 and the conductive layer 857*a* are electrically connected to each other through a connector 825*a*. An FPC1 and conductive layers 857*b* and 857*c* are electrically connected to each other through a connector 825*b*.

As illustrated in FIG. 4B, the light-emitting element 830 includes a first electrode 831, an EL layer 833, and a second electrode 835.

As illustrated in FIG. 4C, the light-emitting element in one embodiment of the present invention may include the first electrode 831, an optical adjustment layer 832, the EL layer 833, and the second electrode 835. A light-transmitting conductive material is preferably used for the optical adjustment layer 832.

As illustrated in FIG. 4D, the transistor FET1 includes a gate electrode 304 over the insulating layer 843, a gate insulating layer 305 covering the gate electrode 304, a semiconductor layer 308*a* over the gate insulating layer 305, and a pair of electrodes (an electrode 310*a* and an electrode 310*b*). The semiconductor layer 308*a* is connected to the pair of electrodes. The pair of electrodes have functions as a source electrode and a drain electrode. The transistor FET1 is covered with an insulating layer 312 and an insulating layer 314. Either the insulating layer 312 or the insulating layer 314 is not necessarily provided. The sensing element C1 includes a first electrode 11 over the insulating layer 314, an insulating layer 852*a* over the first electrode 11, and a second electrode 12 over the insulating layer 852*a*. An insulating layer 852*b* is provided over the second electrode 12, and the light-blocking layer 847 and the coloring layer 845 are provided over the insulating layer 852*b*. Although the transistor FET1 overlaps with the light-blocking layer 847 and the sensing element C1 overlaps with the coloring layer 845 in this example, one embodiment of the present invention is not limited thereto. For example, both the transistor FET1 and the sensing element C1 may overlap with the light-blocking layer 847. In this case, the sensing element C1 does not necessarily have a light-transmitting property. In the case where the electrode of the sensing element C1 overlaps with the coloring layer 845 or a light-emitting region of the light-emitting element 830, the electrode is preferably formed using a light-transmitting material.

The first electrode 11 or the second electrode 12 may be formed using the same material and steps as those of a back gate of the transistor. Although the transistor included in the driver circuit portion 806 includes a back gate in FIG. 4A, one embodiment of the present invention is not limited thereto.

Note that in the input/output device illustrated in FIG. 4A, a user can recognize the wiring, the electrode of the transistor FET1, and the like in some cases. Thus, a film with a low reflecting property or a light-blocking film may be provided between the substrate 803 and the transistor FET1. Alternatively, a conductive film with a low reflecting property may be used as the wiring and the electrode of the transistor FET1.

As illustrated in FIG. 4A, in a light-emitting region of a pixel in the input/output device of one embodiment of the present invention, B/A is greater than or equal to 0.7 and less than or equal to 1.7, where A is a thickness between the EL layer 833 and the insulating layer 813 and B is a thickness between the EL layer 833 and the insulating layer 843. With such a structure, a neutral plane where distortion due to stress such as compressive stress or tensile stress against deformation such as bending does not occur (a plane that does not expand or contract) is positioned in the EL layer or near the EL layer. Thus, separation of the EL layer due to bending or the like can be inhibited, so that the input/output device can be highly reliable. Moreover, the input/output device can have high resistance to repeated bending.

<Specific Example 2 of Cross-sectional Structure>

FIG. 5A is an example of a cross-sectional view of the input/output device of one embodiment of the present invention. FIG. 5B is an enlarged view of a transistor FET2 and a sensing element C2.

The input/output device illustrated in FIG. 5A differs from the input/output device illustrated in FIG. 4A in that the transistor FET2 and the sensing element C2 are included. The same portions as in the input/output device illustrated in FIG. 4A are not described here.

As illustrated in FIG. 5B, the transistor FET2 includes the gate electrode 304 over the insulating layer 843, the gate insulating layer 305 covering the gate electrode 304, the semiconductor layer 308*a* over the gate insulating layer 305, and the pair of electrodes 310*a* and 310*b*. The semiconductor layer 308*a* is connected to the pair of electrodes 310*a* and 310*b*. The pair of electrodes 310*a* and 310*b* have functions as a source electrode and a drain electrode. The transistor FET2 is covered with the insulating layer 312 and the insulating layer 314. Either the insulating layer 312 or the insulating layer 314 is not necessarily provided. The sensing element C2 includes the first electrode 11 over the gate insulating layer 305, the insulating layer 314 and the insulating layer 852*a* over the first electrode 11, and the second electrode 12 over the insulating layer 852*a*. The insulating layer 852*b* is provided over the second electrode 12, and the light-blocking layer 847 and the coloring layer 845 are provided over the insulating layer 852*b*. Although the transistor FET2 overlaps with the light-blocking layer 847 and the sensing element C2 overlaps with the coloring layer 845 in this example, one embodiment of the present invention is not limited thereto. For example, both the transistor FET2 and the sensing element C2 may overlap with the light-blocking layer 847.

In one embodiment of the present invention, the semiconductor layer included in the transistor and the electrode of the sensing element are preferably formed in the same step. This can reduce the number of steps for manufacturing the input/output device, resulting in low manufacturing cost.

For example, an oxide semiconductor can be used for the semiconductor layer of the transistor. An oxide semiconductor layer has a high light-transmitting property. By increasing oxygen vacancies and/or impurities such as hydrogen and water in the oxide semiconductor layer, an oxide semiconductor layer having high carrier density and low resistance (also referred to as an oxide conductor layer) can be obtained. Such an oxide semiconductor layer can be suitably used as an electrode of a capacitor of a touch sensor.

Specifically, plasma treatment is performed on an island-shaped oxide semiconductor layer that is to be the first electrode 11 to increase oxygen vacancies in the oxide semiconductor layer and/or impurities such as hydrogen and water in the oxide semiconductor layer, so that the oxide semiconductor layer can have high carrier density and low resistance.

A typical example of the plasma treatment performed on the oxide semiconductor layer is plasma treatment using a gas containing one of a rare gas (He, Ne, Ar, Kr, or Xe), phosphorus, boron, hydrogen, and nitrogen. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

Furthermore, the insulating layer 314 containing hydrogen is formed in contact with the oxide semiconductor layer to diffuse hydrogen from the insulating layer containing hydrogen to the oxide semiconductor layer, so that the oxide semiconductor layer can have higher carrier density and lower resistance. An example of the insulating film containing hydrogen, that is, an insulating film capable of releasing hydrogen is a silicon nitride film.

The insulating layer 312 is provided over the transistor FET2 in order to prevent the semiconductor layer 308a from being subjected to the plasma treatment. Since the insulating layer 312 is provided, the semiconductor layer 308a is not in contact with the insulating layer 314 containing hydrogen. By forming the insulating layer 312 using an insulating film capable of releasing oxygen, oxygen can be supplied to the semiconductor layer 308a. The semiconductor layer 308a to which oxygen is supplied is an oxide semiconductor in which oxygen vacancies in the film or at the interface are reduced and which has high resistance. Note that as the insulating film capable of releasing oxygen, for example, a silicon oxide film or a silicon oxynitride film can be used.

Figure 6A:
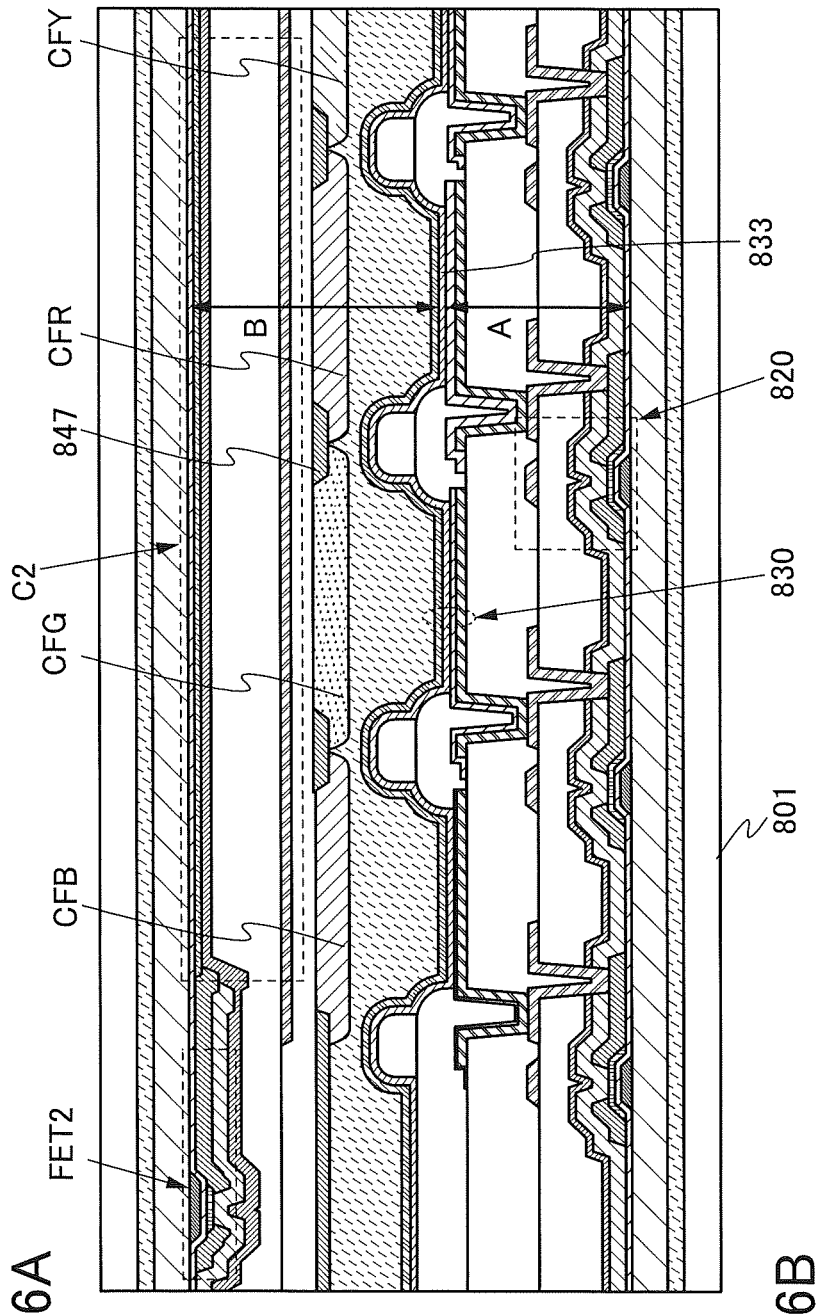
FIGS. 6A to 6C each illustrate an example of an input/output device.

FIG. 6A is a schematic cross-sectional view illustrating an input/output device including four sub-pixels. A color filter method is employed in the input/output device of one embodiment of the present invention. The light-emitting element 830 illustrated in FIG. 6A has a structure similar to the structure illustrated in FIG. 4C and includes the first electrode 831, the optical adjustment layer 832, the EL layer 833, and the second electrode 835 in this order. The combination of a microcavity structure (optical adjustment layer) and a red coloring layer CFR, a green coloring layer CFG, a blue coloring layer CFB, and a yellow coloring layer CFY allows light with high color purity to be extracted from the input/output device of one embodiment of the present invention. The thickness of the optical adjustment layer may be varied depending on the color of the sub-pixel. Note that although FIG. 6A illustrates an example in which the light-blocking layer 847 is provided between the coloring layers CFR and CFG, between the coloring layers CFG and CFB, and between the coloring layers CFR and CFY, the light-blocking layer 847 is not necessarily provided between these coloring layers. In this example, four sub-pixels overlap with one sensing element C2.

Figure 6B:
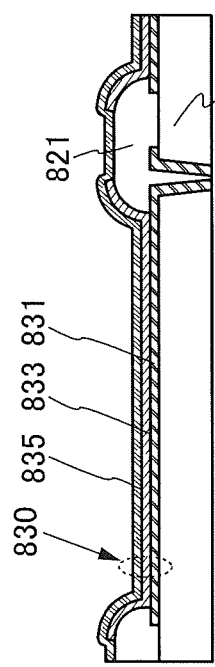

As illustrated in FIG. 6B, the EL layers 833 emitting light of different colors may be separately provided so that subpixels have different EL layers 833. The spacer 823 illustrated in FIG. 4A and the like is not necessarily provided. The conductive layer 856 and the insulating layer 817b illustrated in FIG. 4A and the like are not necessarily provided, and the first electrode 831 may be directly connected to the source electrode or the drain electrode of the transistor.

Figure 6C:
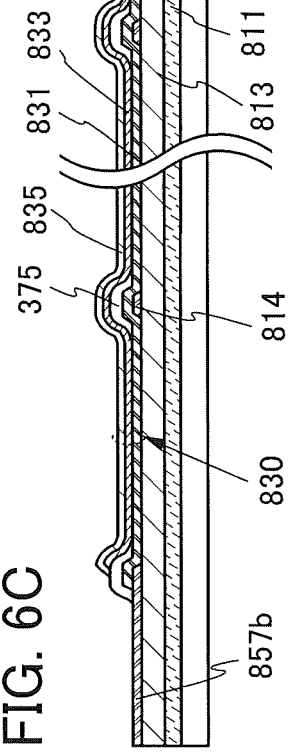

As illustrated in FIG. 6C, the input/output device does not necessarily include the transistor electrically connected to the light-emitting element. The conductive layer 857a and the conductive layer 857b, which are external connection electrodes, can each be electrically connected to an FPC or the like. A conductive layer 814 is preferably, though not necessarily, provided because voltage drop due to the resistance of the first electrode 831 can be inhibited. The conductive layer 814 may be provided between the first electrode 831 and the insulating layer 375. In addition, for a similar purpose, a conductive layer electrically connected to the second electrode 835 may be provided over the insulating layer 375, the EL layer 833, the second electrode 835, or the like.

<Specific Example 3 of Cross-sectional Structure>

Figure 7:
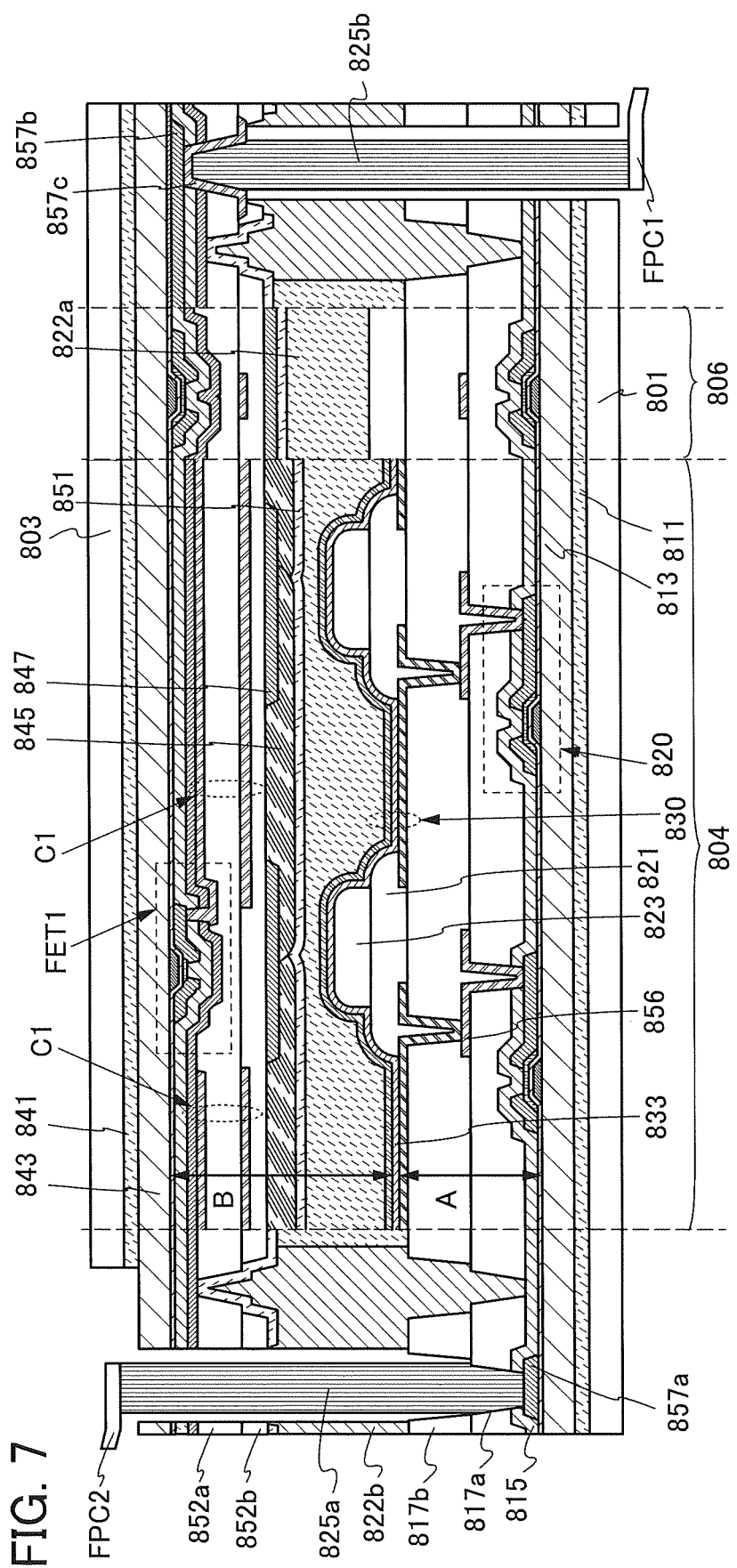
FIG. 7 illustrates an example of an input/output device.

FIG. 7 is an example of a cross-sectional view of the input/output device of one embodiment of the present invention.

The input/output device illustrated in FIG. 7 differs from the input/output device illustrated in FIG. 4A in that a bonding layer 822a and a fourth bonding layer 822b are included. The same portions as in the input/output device illustrated in FIG. 4A are not described here.

In one embodiment of the present invention, the fourth bonding layer 822b with a frame-like shape that surrounds the bonding layer 822a is preferably provided.

When a bonding layer that is positioned between the light-emitting element and the sensing element and is exposed at a side surface of the input/output device has a low gas barrier property, impurities such as moisture and oxygen enter the light-emitting element and the like from the outside. The entry of impurities into an organic EL element causes, for example, shrinkage of a light-emitting portion (here, luminance degradation from an end portion of the light-emitting portion, or an increase in a non-light-emitting region in the light-emitting portion). Thus, the bonding layer that covers an element such as an organic EL element preferably has an excellent gas barrier property (in particular, low water vapor and oxygen permeability).

In the case where a liquid composition whose volume is greatly reduced by curing is used as a material for the bonding layer, stress is applied to the light-emitting element, which might damage the light-emitting element and cause poor light emission. Thus, a reduction in the volume due to curing of a material for the bonding layer is preferably as small as possible.

In the case where the bonding layer is positioned on the side from which light from the light-emitting element is extracted, the light-transmitting property of the bonding layer is preferably high so that the light extraction efficiency of the input/output device is increased.

A plurality of properties are required for the bonding layer as described above, and it is very difficult for the material for the bonding layer to have two or more of those properties.

In view of the above, the bonding layer, which corresponds to the above-described first bonding layer, is surrounded by the fourth frame-like bonding layer. Two types of bonding layers formed using different materials are provided, so that the reliability of the input/output device can be increased. For example, by using the outer bonding layer containing a material having a higher gas barrier property than a material for the inner bonding layer, the entry of moisture or oxygen from the outside into the input/output device can be prevented even when the inner bonding layer is formed using a material that has a low gas barrier property and has a small reduction in volume due to curing, a high light-transmitting property (visible light transmittance, in particular), or a high refractive index. Thus, a highly reliable light-emitting device in which shrinkage of a light-emitting portion is inhibited can be obtained. The properties of the two bonding layers are not limited to the above, and materials having desired properties can be used as appropriate for the bonding layers.

Although an opening is formed in the fourth frame-like bonding layer 822b and the like so that the conductive layers 857a and 857b are electrically connected to the respective FPCs in FIG. 7, an opening may be formed in the bonding layer 822a and the like so that the conductive layer 857a or the conductive layer 857b is electrically connected to the FPC. In that case, a region where the conductive layer 857a or the conductive layer 857b is electrically connected to the FPC is also surrounded by the fourth frame-like bonding layer 822b.

<Specific Example 4 of Cross-sectional Structure>

Figure 8:
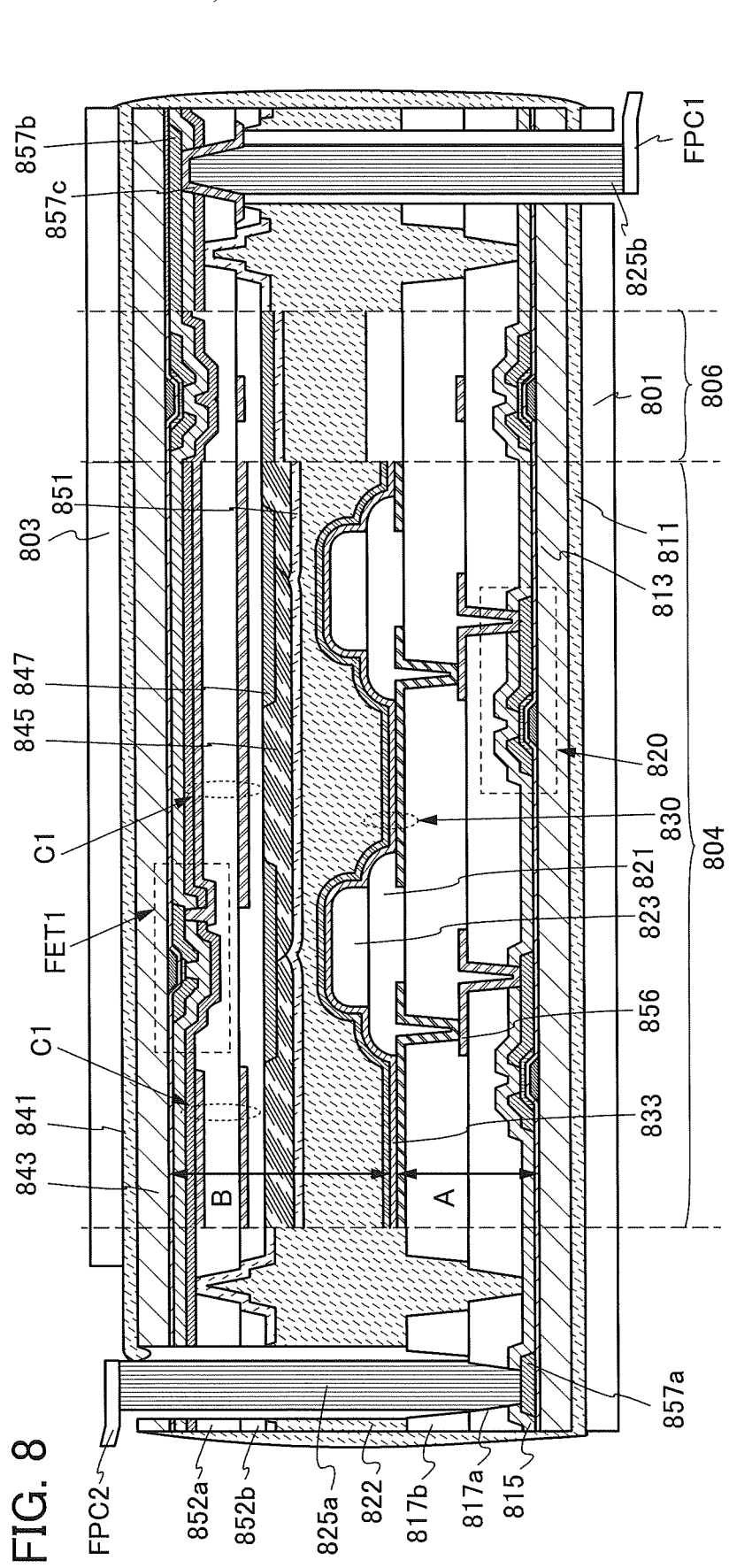
FIG. 8 illustrates an example of an input/output device.

FIG. 8 is an example of a cross-sectional view of the input/output device of one embodiment of the present invention.

The input/output device illustrated in FIG. 8 differs from the input/output device illustrated in FIG. 4A in that an edge of the bonding layer 811 is positioned outside the substrate 801 and that an edge of the bonding layer 841 is positioned outside the substrate 803. The same portions as in the input/output device illustrated in FIG. 4A are not described here.

In one embodiment of the present invention, at least part of the edge of the bonding layer 811 is preferably positioned outside an edge of the substrate 801.

In addition, in one embodiment of the present invention, at least part of the edge of the bonding layer 841 is preferably positioned outside an edge of the substrate 803.

By providing the bonding layers at the edges of the input/output device, the substrate 801, the substrate 803, and the stacked components between the substrates can be firmly attached to each other. Thus, the input/output device can be highly resistant to repeated bending and highly reliable.

In addition, by providing the bonding layers at the edges of the input/output device, the water resistance and the dust resistance of the input/output device can be improved, so that the input/output device can be highly reliable.

Note that a bonding layer may be formed so as to extend to the outside of the edge of the substrate when the substrate and the insulating layer are attached to each other with the bonding layer, or a bonding layer may be additionally formed at an edge of the input/output device with the use of an adhesive after the substrate and the insulating layer are attached to each other.

<Specific Example 5 of Cross-sectional Structure>

FIG. 9A is an example of a cross-sectional view of the input/output device of one embodiment of the present invention.

The input/output device illustrated in FIG. 9A differs from the input/output device illustrated in FIG. 4A in that a conductive layer 857d that is electrically connected through the connector 825b to the FPC1, through which a signal is supplied to the input portion, is positioned over the same substrate as the conductive layer 857a that is electrically connected through the connector 825a to the FPC2, through which a signal is supplied to the display portion. The same portions as in the input/output device illustrated in FIG. 4A are not described here.

When both the conductive layer 857a and the conductive layer 857d are provided on one side of the input/output device, the connection positions of the FPCs can be determined more flexibly: for example, the FPC1 and the FPC2 can be positioned in the same direction. In addition, a pressure bonding step and a transfer step are unlikely to be limited because an FPC does not have to be pressure bonded to one side of the input/output device while another FPC is already attached to the other side of the input/output device. Moreover, connection between an FPC and an IC or the like is unlikely to be limited. In one embodiment of the present invention, signals may be supplied from one FPC to the input portion and the display portion.

The conductive layers 857b and 857c on the input portion side are electrically connected to the conductive layer 857d and a conductive layer 857e through conductive particles 877. The conductive particles 877 are provided so as to be dispersed in the bonding layer 822. Thus, the conductive layers 857b, 857c, 857d, and 857e are electrically connected through the conductive particles 877.

As the conductive particles 877, particles of an organic resin, silica, or the like coated with a conductive material such as a metal material or an alloy material are preferably used. It is preferable to use nickel or gold as the metal material because contact resistance can be decreased. It is also preferable to use particles each coated with layers of two or more kinds of metal materials, such as particles coated with nickel and further with gold. Alternatively, particles of a conductive material may be used as the conductive particles 877.

It is preferred that the conductive particle 877 is deformed by being crushed under vertical pressure. This increases the contact area between the conductive particle 877 and the conductive layers 857c and 857e, whereby electrical connection can be surely made. In many actual cases, the conductive particle has a circular cross-sectional shape or an elliptical cross-sectional shape with a long axis in a direction parallel to the substrates.

As illustrated in FIG. 9B, a resin layer 877b in which conductive particles 877a are dispersed may be provided. The resin layer 877b may be formed using a material different from that for the bonding layer 822. For example, a curable organic resin such as a heat curable organic resin or a photocurable organic resin can be used. The conductive particles 877a in the resin layer 877b are in contact with both the conductive layer 857c and the conductive layer 857e, whereby the conductive layer 857c and the conductive layer 857e are electrically connected to each other.

Materials for the conductive particle 877a and the resin layer 877b can be collectively called an anisotropic conductive paste. For example, a material in which conductive particles are dispersed in a resin such as an epoxy resin can be used. By using the material having anisotropic conductivity, the plurality of conductive layers 857b on the input portion side can be electrically connected to the respective conductive layers 857d on the display portion side.

<Examples of Materials>

Next, materials and the like that can be used for the input/output device are described. Note that description on the components already described in this specification is omitted in some cases.

For each of the substrates, a material such as glass, quartz, an organic resin, a metal, or an alloy can be used. The substrate on the side from which light from the light-emitting element is extracted is formed using a material that transmits the light.

It is particularly preferable to use a flexible substrate. For example, an organic resin; a glass material, a metal, or an alloy that is thin enough to have flexibility;

or the like can be used.

An organic resin, which has a specific gravity smaller than that of glass, is preferably used for the flexible substrate, in which case the input/output device can be more lightweight than in the case where glass is used.

The substrate is preferably formed using a material with high toughness. In that case, the input/output device can have high impact resistance and can be less likely to be broken. For example, when an organic resin substrate or a thin metal or alloy substrate is used, the input/output device can be more lightweight and less likely to be broken than in the case where a glass substrate is used.

A metal material and an alloy material, which have high thermal conductivity, are preferable because they can easily conduct heat to the whole substrate and accordingly can prevent a local temperature rise in the input/output device. The thickness of a substrate using a metal material or an alloy material is preferably greater than or equal to 10 µm and less than or equal to 200 µm, further preferably greater than or equal to 20 µm and less than or equal to 50 µm.

There is no particular limitation on the material for the metal substrate or the alloy substrate, but it is preferable to use, for example, aluminum, copper, nickel, a metal alloy such as an aluminum alloy or stainless steel.

Furthermore, when a material with high thermal emissivity is used for the substrate, the surface temperature of the input/output device can be prevented from rising, leading to prevention of breakage or a decrease in the reliability of the input/output device. For example, the substrate may have a stacked-layer structure of a metal substrate and a layer with high thermal emissivity (e.g., the layer can be formed using a metal oxide or a ceramic material).

Examples of a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose coefficient of thermal expansion is low is preferred, and for example, a polyamide imide resin, a polyimide resin, or PET can be suitably used. A substrate in which a fibrous body is impregnated with a resin (also referred to as prepreg) or a substrate whose coefficient of thermal expansion is reduced by mixing an organic resin with an inorganic filler can also be used.

The flexible substrate may have a stacked-layer structure in which a hard coat layer (such as a silicon nitride layer) by which a surface of the device is protected from damage, a layer (such as an aramid resin layer) that can disperse pressure, or the like is stacked over a layer of any of the above-mentioned materials.

The flexible substrate may be formed by stacking a plurality of layers. When a glass layer is used, a barrier property against water and oxygen can be improved, leading to a highly reliable input/output device.

A flexible substrate in which a glass layer, a bonding layer, and an organic resin layer are stacked from the side closer to a light-emitting element is preferably used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and high flexibility. The thickness of the organic resin layer is greater than or equal to 10 µm and less than or equal to 200 µm, preferably greater than or equal to 20 µm and less than or equal to 50 µm. Providing such an organic resin layer outside the glass layer, breakage or a crack of the glass layer can be inhibited, resulting in increased mechanical strength. With the substrate that includes such a composite material for a glass material and an organic resin, the input/output device can be highly reliable and flexible.

Any of a variety of curable adhesives, e.g., light curable adhesives such as a UV curable adhesive, a reactive curable adhesive, a thermal curable adhesive, and an anaerobic adhesive can be used for the adhesive layer. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can prevent entry of impurities such as moisture into the functional element and can improve the reliability of the input/output device.

In addition, it is preferable to mix a filler with a high refractive index or light-scattering member into the resin, in which case the efficiency of light extraction from the light-emitting element can be improved. For example, titanium oxide, barium oxide, zeolite, zirconium, or the like can be used.

The structure of the transistors in the input/output device is not particularly limited. For example, a forward staggered transistor or an inverted staggered transistor may be used. A top-gate transistor or a bottom-gate transistor may be used. There is no particular limitation on the semiconductor material that is used for the transistors, and for example, an oxide semiconductor, silicon, germanium, or an organic semiconductor can be used.

There is no particular limitation on the state of the semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

For example, for the semiconductor layer, an element belonging to Group 4, a compound semiconductor, or an oxide semiconductor can be used. Specifically, a semiconductor containing silicon, a semiconductor containing gallium arsenide, an oxide semiconductor containing indium, or the like can be used.

An oxide semiconductor is preferably used as a semiconductor where a channel of the transistor is formed. In particular, an oxide semiconductor having a wider band gap than silicon is preferably used. A semiconductor material having a wider band gap and a lower carrier density than silicon is preferably used, in which case the off-state leakage current of the transistor can be reduced.

For example, the oxide semiconductor preferably contains at least indium (In) or zinc (Zn). Further preferably, the oxide semiconductor is In-M-Zn-based oxide (M is a metal such as Al, Ti, Ga, Ge, Y, Zr, Sn, La, Ce, or Hf).

As the semiconductor layer, it is preferable to use an oxide semiconductor film including a plurality of crystal parts. Specifically, the c-axes of the crystal parts are oriented substantially perpendicular to a surface on which the semiconductor layer is formed or the top surface of the semiconductor layer, and adjacent crystal parts have no grain boundary.

Such an oxide semiconductor without grain boundary prevents a crack of an oxide semiconductor film from being caused by stress generated when the input/output device is bent. Consequently, such an oxide semiconductor is preferably used for a flexible input/output device that is bent when used.

The use of such an oxide semiconductor for the semiconductor layer achieves a highly reliable transistor with little change in the electrical characteristics.

Charge accumulated in a capacitor through a transistor can be retained for a long time because of low off-state current of the transistor. The use of such a transistor in pixels allows a driver circuit to stop while the luminance of an image displayed on display regions of the pixels is maintained. As a result, the input/output device can have extremely low power consumption.

Alternatively, silicon is preferably used as a semiconductor in which a channel of a transistor is formed. Silicon may be amorphous silicon but is preferably silicon having crystallinity, such as microcrystalline silicon, polycrystalline silicon, or single crystal silicon. In particular, polycrystalline silicon can be formed at a lower temperature than single crystal silicon and has higher field-effect mobility and higher reliability than amorphous silicon. When such a polycrystalline semiconductor is used for a pixel, the aperture ratio of the pixel can be increased. Even when pixels are provided at very high density, a gate driver circuit and a source driver circuit can be formed over a substrate where the pixels are formed, so that the number of components of an electronic appliance can be reduced.

For stable characteristics of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by sputtering, chemical vapor deposition (CVD) such as a plasma-enhanced CVD, thermal CVD, or metal organic CVD (MOCVD), atomic layer deposition (ALD), coating, printing, or the like. Note that the base film is not necessarily provided. In each of the above structure examples, the insulating layer 813 can also serve as a base film of the transistor.

As the light-emitting element, a self-luminous element can be used, and an element whose luminance is controlled by current or voltage is included in the category of the light-emitting element. For example, a light-emitting diode (LED), an organic EL element, or an inorganic EL element can be used.

A conductive film that transmits visible light is used for the electrode through which light from the light-emitting element is extracted. A conductive film that reflects visible light is preferably used for the electrode through which light is not extracted.

The conductive film that transmits visible light can be formed using, for example, indium oxide, indium tin oxide (ITO), indium zinc oxide, zinc oxide, or zinc oxide to which gallium is added. It is also possible to use a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) when the film is thin enough to have a light-transmitting property. Alternatively, a stack of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, a metal material such as aluminum, gold, platinum, silver, nickel, tungsten, chromium, molybdenum, iron, cobalt, copper, or palladium or an alloy containing any of these metal materials can be used, for example. Lanthanum, neodymium, germanium, or the like may be added to the metal material or the alloy. Moreover, the conductive film can be formed using an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, palladium, and copper, or an alloy of silver and magnesium. An alloy of silver and copper is preferable because of its high heat resistance. When a metal film or a metal oxide film is stacked on an aluminum alloy film, oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, it is possible to use a stacked film of silver and ITO or a stacked film of an alloy of silver and magnesium and ITO.

Each of the electrodes can be formed by an evaporation method or a sputtering method. Alternatively, a discharging method such as an ink-jet method, a printing method such as a screen printing method, or a plating method can be used.

When a voltage higher than the threshold voltage of the light-emitting element is applied between the first electrode 831 and the second electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

For the EL layer 833, either a low molecular compound or a high molecular compound can be used, and an inorganic compound may be used. Each of the layers included in the EL layer 833 can be formed by any of the following methods: an evaporation method (including a vacuum evaporation method), a transfer method, a printing method, an ink-jet method, a coating method, and the like.

The light-emitting element is preferably provided between a pair of insulating films that are highly resistant to moisture, in which case impurities such as water can be prevented from entering the light-emitting element, thereby preventing a decrease in the reliability of the input/output device.

Examples of the insulating film with high resistance to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film with high resistance to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

Insulating films with high resistance to moisture are preferably used as the insulating layer 813 and the insulating layer 843.

As each of the insulating layers 812, 815, and 842, an inorganic insulating film such as a silicon oxide film, a silicon oxynitride film, a silicon nitride film, a silicon nitride oxide film, or an aluminum oxide film can be used, for example. For each of the insulating layers 817, 817*a*, 817*b*, and 852, an organic material such as polyimide, acrylic, polyamide, polyimide amide, or a benzocyclobutene-based resin can be used, for example. Alternatively, a low dielectric constant material (low-k material) or the like can be used. Furthermore, each of the insulating layers may be formed by stacking a plurality of insulating films.

The insulating layer 821 is formed using an organic insulating material or an inorganic insulating material. As a resin, for example, a polyimide resin, a polyamide resin, an acrylic resin, a siloxane resin, an epoxy resin, or a phenol resin can be used. It is particularly preferable that the insulating layer 821 be formed to have an inclined sidewall with continuous curvature by using a photosensitive resin material.

There is no particular limitation on the method for forming the insulating layer 821. A photolithography method, a sputtering method, an evaporation method, a droplet discharging method (e.g., an ink-jet method), a printing method (e.g., screen printing or off-set printing), or the like may be used.

The spacer 823 can be formed using an inorganic insulating material, an organic insulating material, a metal material, or the like. As the inorganic insulating material and the organic insulating material, a variety of materials that can be used for the aforementioned insulating layers can be used, for example. As the metal material, titanium, aluminum, or the like can be used. When the spacer 823 containing a conductive material and the second electrode 835 are electrically connected to each other, a potential drop due to the resistance of the second electrode 835 can be suppressed. The spacer 823 may have a tapered shape or an inverse tapered shape.

The conductive layer that functions as an electrode of the transistor, a wiring, an auxiliary wiring of the light-emitting element, or the like in the input/output device (the input portion and the display portion) can be formed to have a single-layer structure or a layered structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

The coloring layer is a colored layer that transmits light in a specific wavelength range. For example, a red (R) color filter for transmitting light in a red wavelength range, a green (G) color filter for transmitting light in a green wavelength range, and a blue (B) color filter for transmitting light in a blue wavelength range can be used. Each coloring layer is formed in a desired position with any of various materials by a printing method, an ink-jet method, an etching method using photolithography, or the like. The coloring layer can be formed using a metal material, pigment, dye, or the like.

The light-blocking layer is provided between adjacent coloring layers. The light-blocking layer blocks light emitted from an adjacent light-emitting element to prevent color mixture between adjacent light-emitting elements. Here, the coloring layer is provided such that its end portion overlaps with the light-blocking layer, whereby light leakage can be reduced. For the light-blocking layer, a material that blocks light from the light-emitting element can be used; for example, a black matrix can be formed using carbon black; a metal oxide; a composite oxide containing a solid solution of a plurality of metal oxides; or a resin material containing a metal material, pigment, or dye. Note that it is preferable to provide the light-blocking layer in a region other than the light-emitting unit, such as the driver circuit unit, in which case undesired leakage of guided light or the like can be suppressed.

An overcoat that covers the coloring layer and the light-blocking layer may be provided. The overcoat can prevent impurities and the like contained in the coloring layer from being diffused into the light-emitting element. The overcoat is formed with a material that transmits light emitted from the light-emitting element; for example, it is possible to use an inorganic insulating film such as a silicon nitride film or a silicon oxide film, an organic insulating film such as an acrylic film or a polyimide film, or a stacked layer of an organic insulating film and an inorganic insulating film.

For the connector, it is possible to use a paste-like or sheet-like material that is obtained by mixing metal particles into a thermosetting resin and exhibits anisotropic electrical conductivity by thermocompression bonding. As the metal particles, particles in which two or more kinds of metals are layered, for example, nickel particles coated with gold are preferably used.

Note that the input/output device of one embodiment of the present invention may include a display element other than the light-emitting element.

Note that in this specification and the like, a display element, a display device including a display element, a light-emitting element, and a light-emitting device including a light-emitting element can employ various modes or can include various elements. A display element, a display device, a light-emitting element, or a light-emitting device includes at least one of the following, for example: an EL element (e.g., an EL element including organic and inorganic materials, an organic EL element, and an inorganic EL element), an LED (e.g., a white LED, a red LED, a green LED, and a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator (IMOD) element, a MEMS shutter display element, an optical-interference-type MEMS display element, an electrowetting element, a piezoelectric ceramic display, and a display element using a carbon nanotube. Other than the above, a display medium whose contrast, luminance, reflectance, transmittance, or the like is changed by electric or magnetic action may be included. An example of a display device having EL elements is an EL display. Examples of a display device including electron emitters are a field emission display (FED) and an SED-type flat panel display (SED: surface-conduction electron-emitter display). An example of a display device including liquid crystal elements is a liquid crystal display (e.g., a transmissive liquid crystal display, a transflective liquid crystal display, a reflective liquid crystal display, a direct-view liquid crystal display, and a projection liquid crystal display). An example of a display device using electronic ink, Electronic Liquid Powder (registered trademark), or electrophoretic elements is electronic paper. In a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as SRAM can be provided under the reflective electrodes, leading to lower power consumption.

For example, in this specification and the like, it is possible to employ an active matrix method in which an active element (a non-linear element) is included in a pixel or a passive matrix method in which an active element is not included in a pixel.

In the active matrix method, not only a transistor but also a variety of active elements, for example, a metal insulator metal (MIM) or a thin film diode (TFD) can be used. These elements are fabricated with a small number of steps, resulting in low manufacturing cost or high yield. Furthermore, since these elements are small, the aperture ratio can be increased, leading to low power consumption and high luminance.

Since an active element is not used in the passive matrix method, the number of manufacturing steps is small, so that the manufacturing cost can be reduced or the yield can be increased. Furthermore, since an active element is not used, the aperture ratio can be improved, leading to low power consumption or high luminance.

Note that the input/output device of one embodiment of the present invention may be used not only as a display device but also as a lighting device. By using the light-emitting device as a lighting device, it can be used for interior lighting having an attractive design or as lighting from which light radiates in various directions. Alternatively, the light-emitting device may be used as a light source such as a backlight or a front light, that is, a lighting device for a display panel.

Note that although the capacitive touch sensor is used in this embodiment, one embodiment of the present invention is not limited thereto. For example, a variety of sensors (e.g., an optical sensor using a photoelectric conversion element and a pressure-sensitive sensor using a pressure-sensitive element) that can sense the approach or the contact of a sensing target such as a finger, another sensing element, or another input device may be used.

As described above, in one embodiment of the present invention, a neutral plane where distortion due to stress such as compressive stress or tensile stress against deformation such as bending does not occur (a plane that does not expand or contract) is positioned in the EL layer or near the EL layer. Thus, separation of the EL layer due to bending can be inhibited, so that the input/output device can be highly reliable. Moreover, the input/output device can have high resistance to repeated bending.

This embodiment can be combined with any other embodiment as appropriate.

Embodiment 2

In this embodiment, an input portion that can be used in the input/output device of one embodiment of the present invention is described.

<Structure Example 1 of Input Device>

FIGS. 10A, 10B, 10C-1, and 10C-2 illustrate a structure of the input portion 600. FIG. 10A is a block diagram illustrating the structure of the input portion 600. FIG. 10B is a circuit diagram illustrating configurations of a converter CONV and a sensing unit 10U. FIGS. 10C-1 and 10C-2 are timing charts for explaining a method for driving the sensing unit 10U.

The input portion 600 described in this embodiment includes a plurality of sensing units 10U arranged in a matrix, selection signal lines G1 to which the sensing units 10U arranged in the row direction are electrically connected, signal lines DL to which the sensing units 10U arranged in the column direction are electrically connected, and the first substrate 101 provided with the sensing units 10U, the selection signal lines G1, and the signal lines DL (see FIG. 10A).

For example, the plurality of sensing units 10U can be arranged in a matrix of n rows and m columns (n and m are each a natural number of 1 or more).

The sensing unit 10U includes a sensing element C having the second electrode 12 electrically connected to a wiring CS. Thus, the potential of the second electrode 12 of the sensing element C can be controlled using a control signal supplied through the wiring CS.

The sensing unit 10U includes a first transistor M1 in which a gate is electrically connected to the first electrode 11 of the sensing element C and a first electrode is electrically connected to a wiring VPI (see FIG. 10B). The wiring VPI can supply, for example, a ground potential.

The sensing unit 10U may include a second transistor M2 in which a gate is electrically connected to the selection signal line G1, a first electrode is electrically connected to a second electrode of the first transistor M1, and a second electrode is electrically connected to the signal line DL. The selection signal line G1 can supply a selection signal. The signal line DL can supply, for example, the sensing signal DATA.

The sensing unit 10U may include a third transistor M3 in which a gate is electrically connected to a wiring RES, a first electrode is electrically connected to the first electrode 11 of the sensing element C, and a second electrode is electrically connected to a wiring VRES. The wiring RES can supply a reset signal. The wiring VRES can supply, for example, a potential capable of turning on the first transistor M1.

The capacitance of the sensing element C is changed when an object comes close to the first electrode 11 or the second electrode 12 or when the distance between the first electrode 11 and the second electrode 12 is changed, for example. Thus, the sensing unit 10U can supply the sensing signal DATA based on a change in the capacitance of the sensing element C or parasitic capacitance.

The sensing unit 10U includes the wiring CS that can supply a control signal capable of controlling the potential of the second electrode 12 of the sensing element C.

A node where the first electrode 11 of the sensing element C, the gate of the first transistor M1, and the first electrode of the third transistor M3 are electrically connected is referred to as a node A.

The wiring VPI can supply, for example, a ground potential. The wiring VRES, a wiring VPO, and a wiring BR can supply, for example, a high power supply potential sufficient to turn on a transistor.

The wiring RES can supply a reset signal. The selection signal line G1 can supply a selection signal. The wiring CS can supply a control signal for controlling the potential of the second electrode 12 of the sensing element C. Note that the second electrode 12 may also serve as the wiring CS.

The signal line DL can supply the sensing signal DATA. A terminal OUT can supply a signal obtained by conversion based on the sensing signal DATA.

A driver circuit GD can supply, for example, a selection signal at given timings. The converter CONV has a conversion circuit. A variety of circuits that can convert the sensing signal DATA and supply the resulting signal to the terminal OUT can be used for the converter CONV. For example, a source follower circuit or a current mirror circuit may be configured by electrically connecting the converter CONV to the sensing unit 10U.

Specifically, a source follower circuit can be configured with the converter CONV using a transistor M4 (see FIG. 10B). Note that the transistor M4 may be a transistor that can be fabricated in the same steps as the first to third transistors M1 to M3.

<Method for Driving Sensing Unit 10U>

A method for driving the sensing unit 10U is described.

<<First Step>>

In a first step, a reset signal for turning on the third transistor M3 and subsequently turning off the third transistor M3 is supplied to the gate of the third transistor M3, and a potential of the first electrode 11 of the sensing element C is set at a predetermined potential (see Period T1 in FIG. 10C-1).

Specifically, a reset signal is supplied from the wiring RES. The third transistor M3 supplied with the reset signal makes the node A have a potential capable of turning on the first transistor M1, for example (see FIG. 10B).

<<Second Step>>

In a second step, a selection signal for turning on the second transistor M2 is supplied to the gate of the second transistor M2, and the second electrode of the first transistor M1 is made electrically connected to the signal line DL.

Specifically, a selection signal is supplied from the selection signal line G1. The second transistor M2 supplied with the selection signal electrically connects the second electrode of the first transistor M1 to the signal line DL (see Period T2 in FIG. 10C-1).

<<Third Step>>

In a third step, a control signal is supplied to the second electrode 12 of the sensing element C, and a potential that varies depending on the control signal and the capacitance of the sensing element C is supplied to the gate of the first transistor M1.

Specifically, a rectangular control signal is supplied from the wiring CS. With supply of the rectangular control signal to the second electrode 12, the potential of the node A rises depending on the capacitance of the sensing element C (see the latter half of Period T2 in FIG. 10C-1).

For example, when the sensing element C is placed in the air and an object with a higher dielectric constant than the air comes close to the second electrode 12 of the sensing element C, the apparent capacitance of the sensing element C increases.

Consequently, a change in the potential of the node A due to a rectangular control signal is smaller than that when an object with a higher dielectric constant than the air is not placed close to the second electrode of the sensing element C (see a solid line in FIG. 10C-2).

<<Fourth Step>>

In a fourth step, a signal based on a change in the gate potential of the first transistor M1 is supplied to the signal line DL.

For example, a current that is changed on the basis of a change in the gate potential of the first transistor M1 is supplied to the signal line DL.

The converter CONV converts a change in current flowing through the signal line DL into a change in voltage and outputs the voltage.

<<Fifth Step>>

In a fifth step, a selection signal for turning off the second transistor M2 is supplied to the gate of the second transistor M2.

The first to fifth steps are repeated for every row of the selection signal lines G1(1) to G1(n).

<Structure Example 2 of Input Device>

FIGS. 11A to 11C illustrate a structure of an input portion 600B. FIG. 11A is a block diagram illustrating the structure of the input portion 600B. FIG. 11B is a circuit diagram illustrating structures of a converter CONV and a sensing unit 10UB. FIG. 11C is a timing chart for explaining a method for driving the sensing unit 10UB.

The input portion 600B differs from the input portion 600 in that the sensing unit 10UB is provided instead of the sensing unit 10U.

The sensing unit 10UB differs from the sensing unit 10U in the following two aspects. The first aspect is that the second electrode 12 of the sensing element C is electrically connected to the selection signal line G1. The second aspect is that the second electrode of the first transistor M1 in the sensing unit 10UB is electrically connected to the signal line DL without through the second transistor M2. Here, different structures are described in detail, and the above description is referred to for the other similar structures.

The input portion 600B includes the plurality of sensing units 10UB arranged in a matrix, selection signal lines G1 to which the sensing units 10UB arranged in the row direction are electrically connected, signal lines DL to which the sensing units 10UB arranged in the column direction are electrically connected, and the first substrate 101 provided with the sensing units 10UB, the selection signal lines G1, and the signal lines DL (see FIG. 11A).

For example, the plurality of sensing units 10UB can be arranged in a matrix of n rows and m columns (n and m are each a natural number of 1 or more).

The sensing unit 10UB includes the sensing element C having the second electrode 12 electrically connected to the selection signal line G1. Thus, the potential of the second electrode 12 of the sensing element C can be controlled using a selection signal for each group of sensing units 10UB electrically connected to one selected selection signal line G1.

The selection signal line G1 can be a wiring formed using a conductive film that can be formed in the same steps as the signal line DL.

Alternatively, the selection signal line G1 may be a wiring formed using a conductive film that can be formed in the same steps as the second electrode 12 of the sensing element C. For example, the second electrodes 12 in the sensing units 10UB adjacent in the row direction can be connected to each other and the connected second electrodes can be used as the selection signal line G1.

A method for driving the sensing unit 10UB is described.
<<First Step>>

In a first step, a reset signal for turning on the third transistor M3 and subsequently turning off the third transistor M3 is supplied to the gate of the third transistor M3, and a potential of the first electrode 11 of the sensing element C is set at a predetermined potential (see Period T1 in FIG. 11C).

Specifically, a reset signal is supplied from the wiring RES. The third transistor M3 supplied with the reset signal makes the node A have a potential capable of turning on the first transistor M1, for example (see FIG. 11B).
<<Second Step>>

In a second step, a selection signal is supplied to the second electrode 12 of the sensing element C, and a potential that varies depending on the selection signal and the capacitance of the sensing element C is supplied to the gate of the first transistor M1 (see Period T2 in FIG. 11C).

Specifically, a rectangular selection signal is supplied from the selection signal line G1(i−1). With supply of the rectangular selection signal to the second electrode 12, the potential of the node A rises depending on the capacitance of the sensing element C.

For example, in the case where the sensing element C is placed in the air and an object with a higher dielectric constant than the air is placed close to the second electrode 12 of the sensing element C, the apparent capacitance of the sensing element C increases.

Consequently, a change in the potential of the node A due to a rectangular control signal is smaller than that in the case where an object with a higher dielectric constant than the air is not placed close to the second electrode of the sensing element C.
<<Third Step>>

In a third step, a signal based on a change in the gate potential of the first transistor M1 is supplied to the signal line DL.

For example, a current that is changed on the basis of a change in the gate potential of the first transistor M1 is supplied to the signal line DL.

The converter CONV converts a change in current flowing through the signal line DL into a change in voltage, and the terminal OUT outputs the voltage.

The first to third steps are repeated for every row of the selection signal lines G1(1) to G1(n) (see Periods T2 to T4 in FIG. 11C).

This embodiment can be combined with any other embodiment as appropriate.

Embodiment 3

In this embodiment, a method for manufacturing a flexible input/output device of one embodiment of the present invention is described.

Figure 12A:
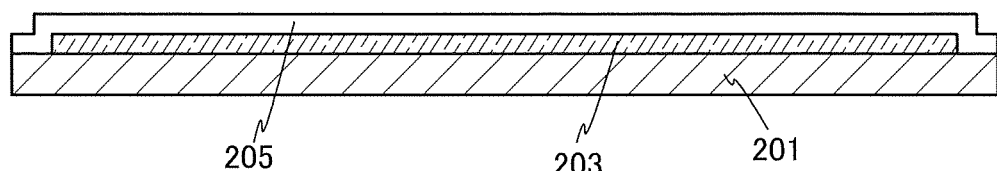
FIGS. 12A to 12D illustrate an example of a method for manufacturing an input/output device.
Figure 12B:
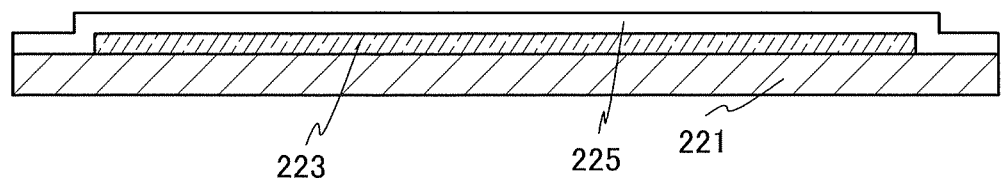

First, a separation layer 203 is formed over a formation substrate 201, and a layer 205 to be separated (hereinafter referred to simply as a layer 205) is formed over the separation layer 203 (see FIG. 12A). Moreover, a separation layer 223 is formed over a formation substrate 221, and a layer 225 to be separated (hereinafter referred to simply as a layer 225) is formed over the separation layer 223 (see FIG. 12B).

Although an example in which the separation layer is formed to have an island shape is described here, one embodiment of the present invention is not limited to this example. In this step, the material for the separation layer is selected such that separation occurs at the interface between the formation substrate and the separation layer, the interface between the separation layer and the layer to be separated, or in the separation layer when the layer to be separated is separated from the formation substrate. Although an example in which separation occurs at the interface between the separation layer and the layer to be separated is described in this embodiment, one embodiment of the present invention is not limited to such an example and depends on materials used for the separation layer and the layer to be separated. Note that in the case where the layer to be separated has a stacked-layer structure, a layer in contact with the separation layer is particularly referred to as a first layer.

For example, when the separation layer has a stacked-layer structure of a tungsten film and a tungsten oxide film and separation occurs at the interface between the tungsten film and the tungsten oxide film (or the vicinity of the interface), part of the separation layer (here, part of the tungsten oxide film) may remain on the layer to be separated. Moreover, the separation layer remaining on the layer to be separated may be removed after separation.

As the formation substrate, a substrate having heat resistance high enough to withstand at least the process temperature in a manufacturing process is used. As the formation substrate, for example, a glass substrate, a quartz substrate, a sapphire substrate, a semiconductor substrate, a ceramic substrate, a metal substrate, a resin substrate, or a plastic substrate can be used.

When a glass substrate is used as the formation substrate, an insulating film such as a silicon oxide film, a silicon oxynitride film, a silicon nitride film, or a silicon nitride oxide film is preferably formed as a base film between the formation substrate and the separation layer, in which case contamination from the glass substrate can be prevented.

The separation layer can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or In—Ga—Zn oxide may be used. The separation layer is preferably formed using a high-melting point metal material such as tungsten, titanium, or molybdenum, in which case the degree of freedom of the process for forming the layer to be separated can be increased.

The separation layer can be formed by, for example, a sputtering method, a plasma-enhanced CVD method, a coating method (including a spin coating method, a droplet discharging method, and a dispensing method), or a printing method. The thickness of the separation layer ranges from 10 nm to 200 nm, for example, and preferably from 20 nm to 100 nm.

When the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

When the separation layer has a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Note that the separation layer is not necessarily provided in the case where separation at an interface between the formation substrate and the layer to be separated is possible. For example, a glass substrate is used as the formation substrate, and an organic resin such as polyimide, polyester, polyolefin, polyamide, polycarbonate, or acrylic is formed in contact with the glass substrate. Next, adhesion between the formation substrate and the organic resin is increased by laser light irradiation or heat treatment. Then, an insulating film, a transistor, and the like are formed over the organic resin. After that, separation at the interface between the formation substrate and the organic resin can be performed by performing laser light irradiation with higher energy density than the above laser light irradiation or performing heat treatment at a higher temperature than the above heat treatment. Moreover, the interface between the formation substrate and the organic resin may be soaked in a liquid to perform separation.

Since the insulating film, the transistor, and the like are formed over the organic resin having low heat resistance in the above method, it is impossible to expose the substrate to high temperatures in the manufacturing process. Note that a transistor using an oxide semiconductor is not necessarily processed at high temperatures and thus can be favorably formed over the organic resin.

The organic resin may be used for a substrate of the device. Alternatively, the organic resin may be removed and another substrate may be bonded to an exposed surface of the layer to be separated with the use of an adhesive.

Alternatively, separation at the interface between a metal layer and the organic resin may be performed in the following manner: the metal layer is provided between the formation substrate and the organic resin and current is made to flow in the metal layer so that the metal layer is heated.

There is no particular limitation on a layer formed as the layer to be separated.

The insulating layers 813 and 843 formed in contact with the separation layer preferably has a single-layer structure or a stacked-layer structure including any of a silicon nitride film, a silicon oxynitride film, a silicon oxide film, a silicon nitride oxide film, and the like.

The insulating layers 813 and 843 can be formed by a sputtering method, a plasma-enhanced CVD method, a coating method, a printing method, or the like. For example, the insulating layer is formed at temperatures ranging from 250° C. to 400° C. by a plasma-enhanced CVD method, whereby the insulating layer can be a dense film with high moisture resistance. The thickness of the insulating layer ranges preferably from 10 nm to 3000 nm, more preferably from 200 nm to 1500 nm.

Figure 12C:
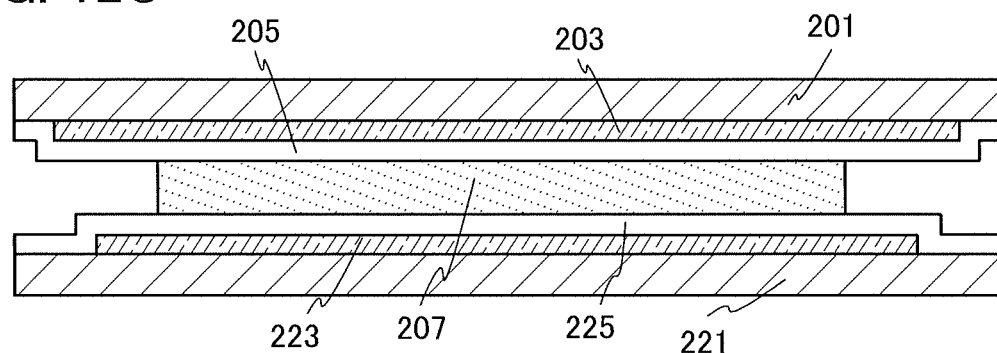

Next, the formation substrate 201 and the formation substrate 221 are attached to each other with a bonding layer 207 so that surfaces on which the layers to be separated are formed face each other, and the bonding layer 207 is cured (see FIG. 12C).

Note that the formation substrate 201 and the formation substrate 221 are preferably attached to each other in a reduced-pressure atmosphere.

Figure 12D:
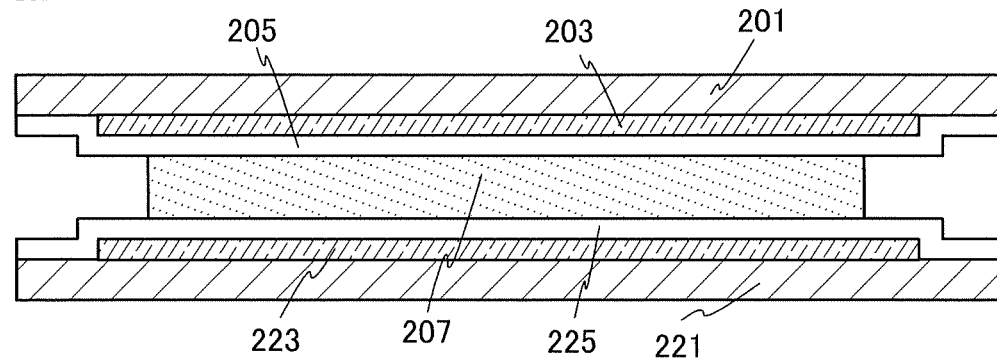

Although FIG. 12C illustrates the case where the separation layer 203 and the separation layer 223 have different sizes, the separation layers may have the same size as illustrated in FIG. 12D.

The bonding layer 207 is provided to overlap with the separation layer 203, the layer 205, the layer 225, and the separation layer 223. The edges of the bonding layer 207 are preferably positioned inside edges of at least one of the separation layer 203 and the separation layer 223 (the one intended to be separated first). Accordingly, strong adhesion between the formation substrate 201 and the formation substrate 221 can be suppressed; thus, a decrease in yield of a subsequent separation process can be suppressed.

As the bonding layer 207, various curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC resin, a PVB resin, and an EVA resin. A material with low moisture permeability, such as an epoxy resin, is particularly preferred. For the adhesive, a material having fluidity low enough to dispose the material only in a desired region is preferably used. For example, an adhesive sheet, a bonding sheet, or a sheet-like or film-like adhesive can be used, and an optical clear adhesive (OCA) film can be preferably used.

The adhesive may have adhesion before attachment or exhibit adhesion after attachment by heating or light irradiation.

Furthermore, the resin may include a drying agent. For example, it is possible to use a substance that adsorbs moisture by chemical adsorption, such as oxide of an alkaline earth metal (e.g., calcium oxide or barium oxide), or a substance that adsorbs moisture by physical adsorption, such as zeolite or silica gel. The drying agent is preferably included, in which case it can suppress deterioration of the functional element due to entry of moisture in the air and can improve the reliability of the device.

Figure 13A:
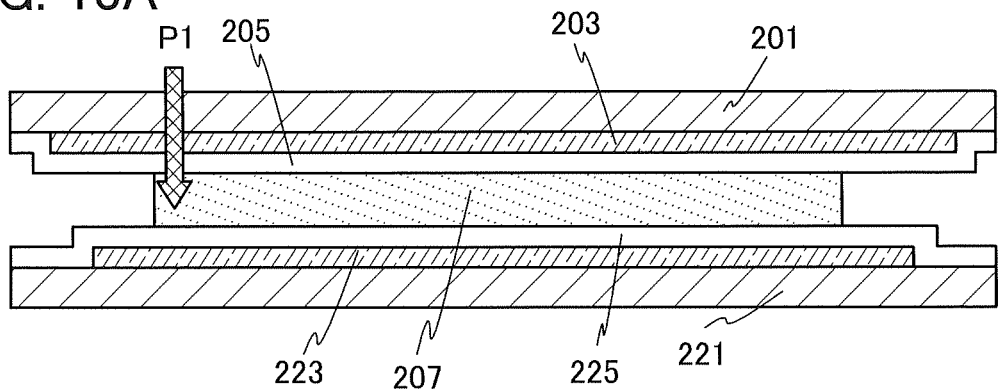
FIGS. 13A to 13D illustrate an example of a method for manufacturing an input/output device.
Figure 13B:
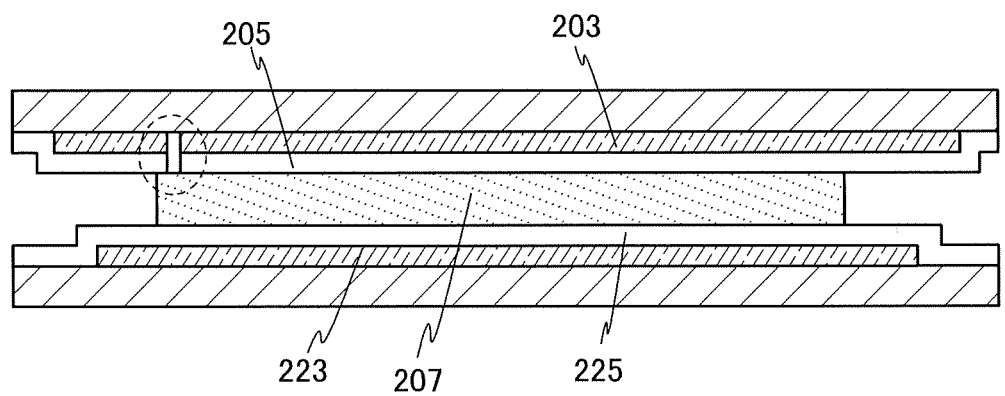

Next, a separation trigger is formed by laser light irradiation (see FIGS. 13A and 13B).

Either the formation substrate 201 or the formation substrate 221 may be separated first. In the case where the separation layers differ in size, a substrate over which a larger separation layer is formed may be separated first or a substrate over which a smaller separation layer is formed may be separated first. In the case where an element such as a semiconductor element, a light-emitting element, or a display element is formed only over one of the substrates, the substrate where the element is formed may be separated first or the other substrate may be separated first. Here, an example in which the formation substrate 201 is separated first is described.

A region where the cured bonding layer 207, the layer 205, and the separation layer 203 overlap with each other is irradiated with laser light (see an arrow P1 in FIG. 13A).

Part of the first layer is removed; thus, the separation trigger can be formed (see a region surrounded by a dashed line in FIG. 13B). At this time, not only the first layer but also the separation layer 203, the bonding layer 207, or another layer included in the layer 205 may be partly removed.

Laser light is preferably applied toward the substrate provided with the separation layer that is desirably separated. When a region where the separation layer 203 and the separation layer 223 overlap with each other is irradiated with laser light, the formation substrate 201 and the separation layer 203 can be selectively separated by cracking only the layer 205 between the layer 205 and the layer 225 (see the region surrounded by the dashed line in FIG. 13B. Here, an example in which films of the layer 205 are partly removed is shown).

Figure 13C:
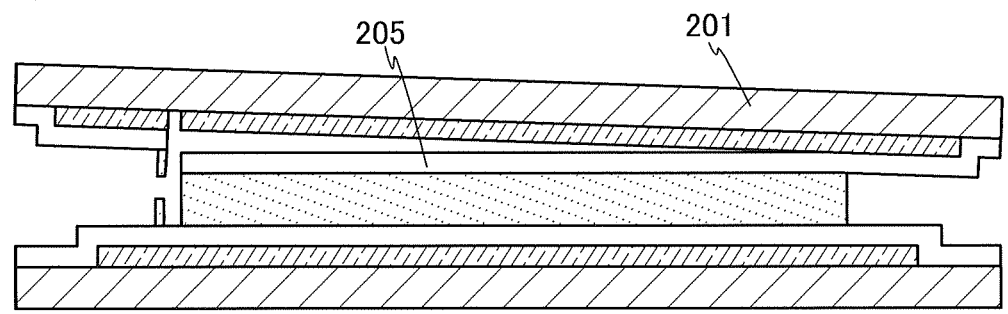
Figure 13D:
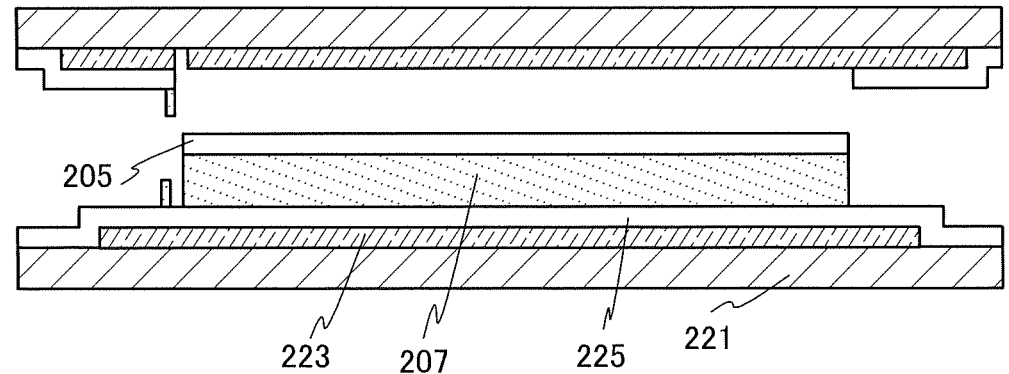

Then, the layer 205 and the formation substrate 201 are separated from each other from the separation trigger (see FIGS. 13C and 13D). Thus, the layer 205 can be transferred from the formation substrate 201 to the formation substrate 221.

For example, the layer 205 and the formation substrate 201 may be separated from the separation trigger by mechanical force (e.g., a separation process with a human hand or a gripper, or a separation process by rotation of a roller).

Alternatively, the formation substrate 201 and the layer 205 may be separated by filling the interface between the separation layer 203 and the layer 205 with a liquid such as water. A portion between the separation layer 203 and the layer 205 absorbs a liquid through capillarity action, so that the separation layer 203 can be separated easily. Furthermore, an adverse effect of static electricity caused at separation on the functional element included in the layer 205 (e.g., damage to a semiconductor element from static electricity) can be suppressed.

Figure 14A:
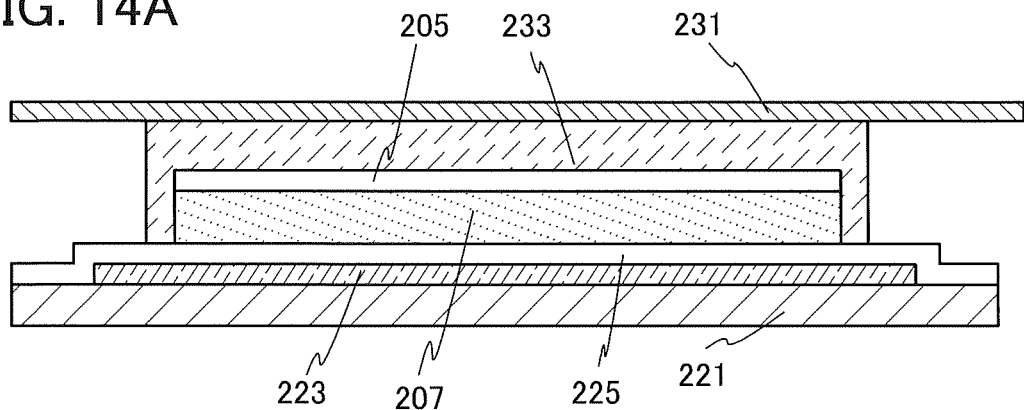
FIGS. 14A to 14D illustrate an example of a method for manufacturing an input/output device.

Next, the exposed layer 205 is attached to a substrate 231 with a bonding layer 233, and the bonding layer 233 is cured (see FIG. 14A).

Note that the layer 205 and the substrate 231 are preferably attached to each other in a reduced-pressure atmosphere.

Subsequently, a separation trigger is formed by laser light irradiation (see FIGS. 14B and 14C).

Figure 14B:
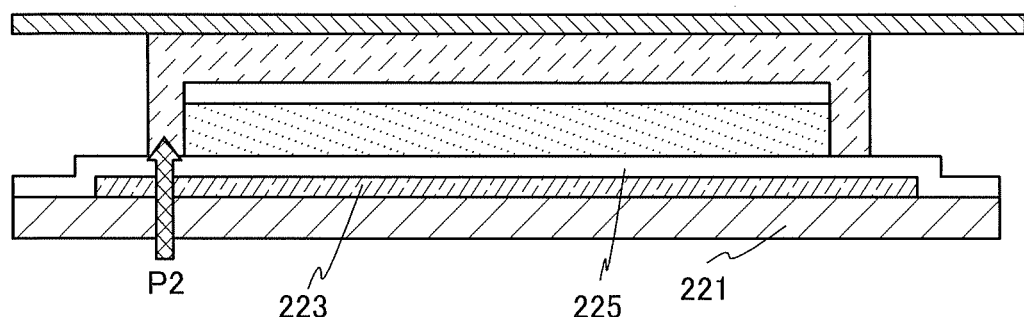
Figure 14C:
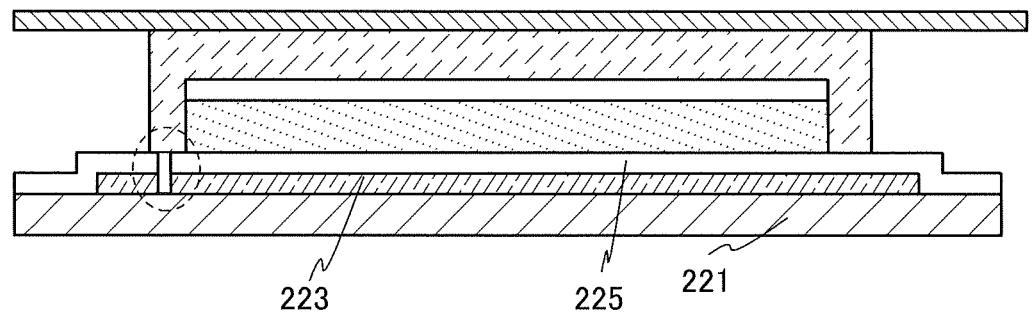

A region where the cured bonding layer 233, the layer 225, and the separation layer 223 overlap with each other is irradiated with laser light (see an arrow P2 in FIG. 14B). Part of the first layer is removed; thus, the separation trigger can be formed (see a region surrounded by a dashed line in FIG. 14C. Here, an example in which films of the layer 225 are partly removed is shown). At this time, not only the first layer but also the separation layer 223, the bonding layer 233, or another layer included in the layer 225 may be partly removed.

Laser light is preferably applied toward the formation substrate 221 provided with the separation layer 223.

Figure 14D:
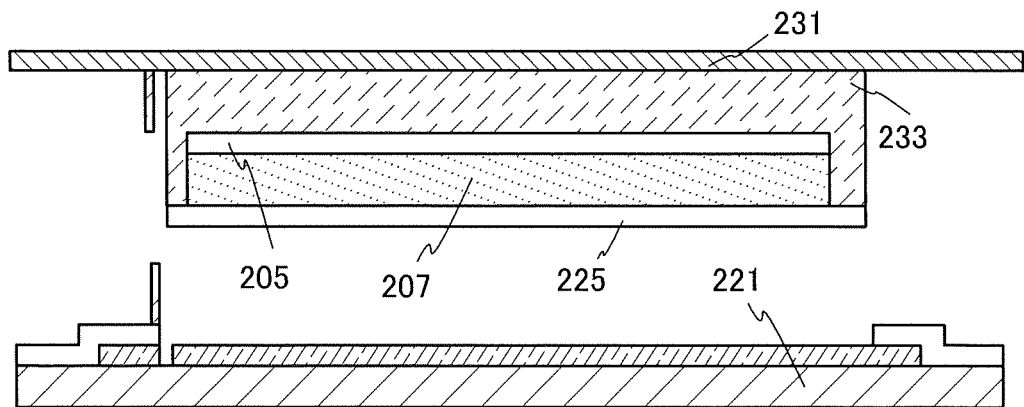

Then, the layer 225 and the formation substrate 221 are separated from each other from the separation trigger (see FIG. 14D). Accordingly, the layer 205 and the layer 225 can be transferred to the substrate 231.

In the above method for manufacturing the light-emitting device of one embodiment of the present invention, separation is performed in such a manner that a separation trigger is formed by laser light irradiation after a pair of formation substrates each provided with a separation layer and a layer to be separated are attached to each other and then the separation layers and the layers to be separated are made in a state where separation is easily performed. Thus, the yield of the separation process can be improved.

In addition, separation is performed after the formation substrates each provided with the layer to be separated are attached to each other in advance, and then a substrate where a device is intended to be formed can be attached to the layers to be separated. Thus, to attach the layers to be separated to each other, formation substrates having low flexibility can be attached to each other; thus, alignment accuracy at the time of attachment can be improved as compared to the case where flexible substrates are attached to each other.

Figure 15A:
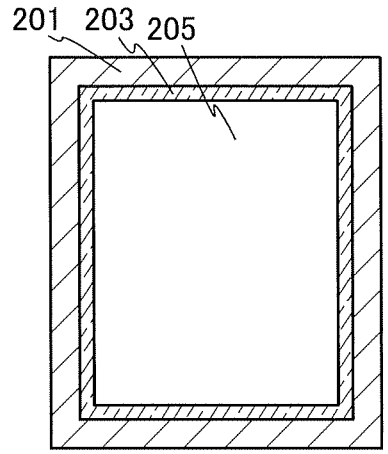
FIGS. 15A to 15C each illustrate an example of a method for manufacturing an input/output device.
Figure 15B:
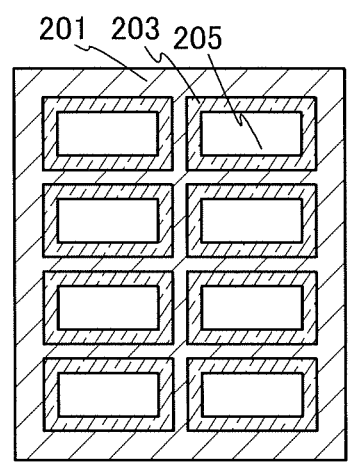
Figure 15C:
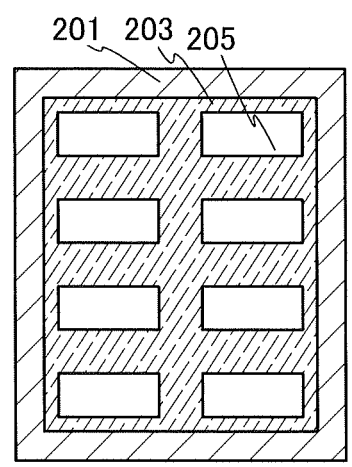

As illustrated in FIG. 15A, the edge of the layer 205 to be separated is preferably positioned on the inner side of the edge of the separation layer 203, in which case the yield of the separation process can be improved. When there are a plurality of layers 205 to be separated, the separation layer 203 may be provided for each layer 205 as illustrated in FIG. 15B or a plurality of layers 205 may be provided over one separation layer 203 as illustrated in FIG. 15C.

This embodiment can be combined with any other embodiment as appropriate.

Embodiment 4

In this embodiment, electronic appliances and lighting devices that can be fabricated according to one embodiment of the present invention are described with reference to FIGS. 16A to 16G and FIGS. 17A to 17I.

The input/output device of one embodiment of the present invention are flexible and thus are preferably used in a flexible electronic appliance and a flexible lighting device. According to one embodiment of the present invention, an electronic appliance and a lighting device that have high reliability and high resistance to repeated bending can be achieved.

Examples of electronic appliances include a television set (also referred to as television or television receiver), a monitor of a computer or the like, a camera such as a digital camera and a digital video camera, a digital photo frame, a mobile phone (also referred to as a cellular phone or mobile phone device), a portable game machine, a portable information terminal, an audio reproducing device, and a large game machine such as a pachinko machine.

The input/output device of one embodiment of the present invention has flexibility and therefore can be incorporated along a curved inside/outside wall surface of a house or a building or a curved interior/exterior surface of a car.

An electronic appliance of one embodiment of the present invention may include an input/output device and a secondary battery. In that case, it is preferred that the secondary battery is capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

An electronic appliance of one embodiment of the present invention may include an input/output device and an antenna. Receiving a signal with the antenna enables a display portion to display video, information, and the like. When the electronic appliance includes a secondary battery, the antenna may be used for non-contact power transmission.

Figure 16A:
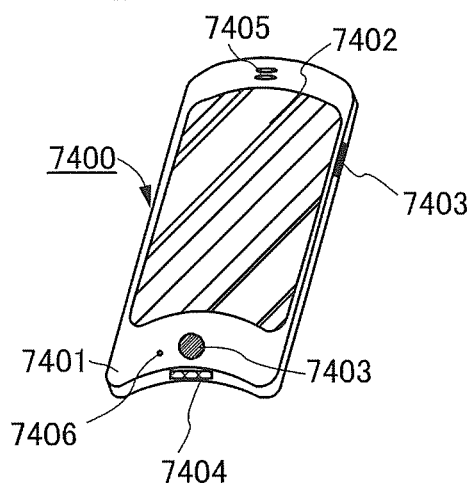
FIGS. 16A to 16G illustrate examples of electronic appliances and lighting devices.

FIG. 16A illustrates an example of a mobile phone. A mobile phone 7400 is provided with a display portion 7402 incorporated in a housing 7401, an operation button 7403, an external connection port 7404, a speaker 7405, a microphone 7406, and the like. The mobile phone 7400 is manufactured using the input/output device of one embodiment of the present invention for the display portion 7402. According to one embodiment of the present invention, a highly reliable mobile phone having a curved display portion can be provided with a high yield.

When the display portion 7402 of the mobile phone 7400 in FIG. 16A is touched with a finger or the like, data can be input to the mobile phone 7400. Operations such as making a call and inputting letters can be performed by touch on the display portion 7402 with a finger or the like.

With the operation button 7403, the power can be turned on and off. Furthermore, types of images displayed on the display portion 7402 can be switched; for example, the image can be switched from a mail creation screen to a main menu.

Figure 16B:
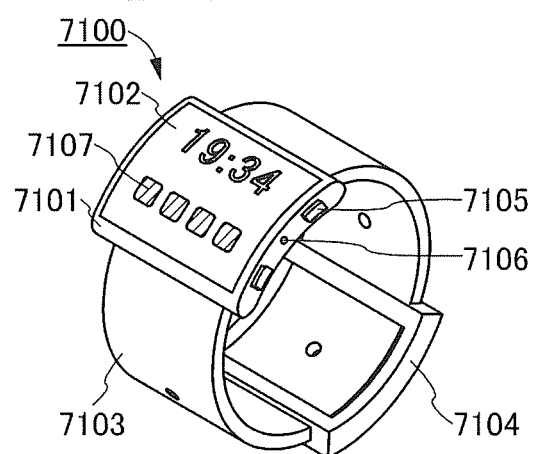

FIG. 16B illustrates an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is curved, and images can be displayed on the curved display surface. The display portion 7102 includes a touch sensor, and operation can be performed by touching the screen with a finger, a stylus, or the like. For example, an application can be started by touching an icon 7107 displayed on the display portion 7102.

With the operation button 7105, a variety of functions such as time setting, power on/off, on/off control of wireless communication, setting and cancellation of manner mode, and setting and cancellation of power saving mode can be performed. For example, the functions of the operation button 7105 can be set freely by the operating system incorporated in the portable information terminal 7100.

The portable information terminal 7100 can employ near field communication, which is a communication method based on an existing communication standard. In that case, for example, hands-free calling is possible with mutual communication between the portable information terminal 7100 and a headset capable of wireless communication.

Since the portable information terminal 7100 includes the input/output terminal 7106, data can be directly transmitted to and received from another information appliance via a connector. Charging through the input/output terminal 7106 is possible. Note that the charging operation may be performed by wireless power feeding without using the input/output terminal 7106.

The display portion 7102 of the portable information terminal 7100 includes the input/output device of one embodiment of the present invention. According to one embodiment of the present invention, a highly reliable portable information terminal having a curved display portion can be provided with a high yield.

Figure 16C:
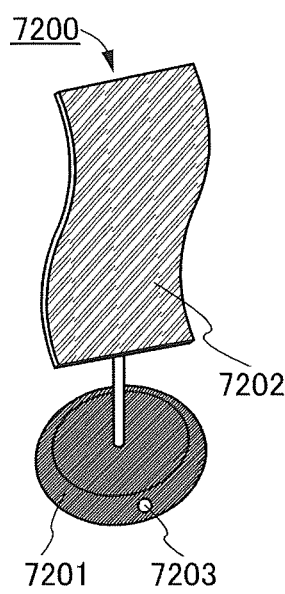
Figure 16D:
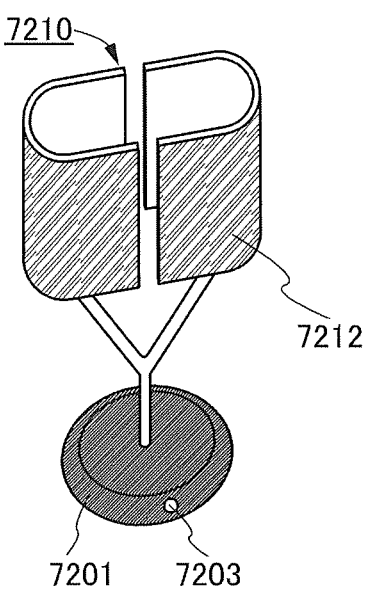
Figure 16E:
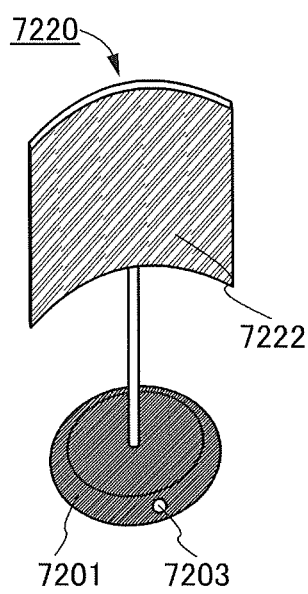

FIGS. 16C to 16E illustrate examples of lighting devices. Lighting devices 7200, 7210, and 7220 each include a stage 7201 provided with an operation switch 7203 and a light-emitting portion supported by the stage 7201.

The lighting device 7200 illustrated in FIG. 16C includes a light-emitting portion 7202 with a wave-shaped light-emitting surface and thus is a good-design lighting device.

A light-emitting portion 7212 included in the lighting device 7210 in FIG. 16D has two convex-curved light-emitting portions symmetrically placed. Thus, light radiates from the lighting device 7210 in all directions.

The lighting device 7220 illustrated in FIG. 16E includes a concave-curved light-emitting portion 7222. This is suitable for illuminating a specific range because light emitted from the light-emitting portion 7222 is collected at the front of the lighting device 7220.

The light-emitting portion included in each of the lighting devices 7200, 7210, and 7220 is flexible; accordingly, the light-emitting portion may be fixed on a plastic member, a movable frame, or the like so that a light-emitting surface of the light-emitting portion can be bent freely depending on the intended use.

Although the lighting devices in which the light-emitting portion is supported by the stage are described as examples, a housing provided with a light-emitting portion can be fixed on a ceiling or suspended from a ceiling. Since the light-emitting surface can be curved, the light-emitting surface can be bent concavely so that a particular region is brightly illuminated, or bent convexly so that the whole room is brightly illuminated.

Here, each of the light-emitting portions includes the input/output device of one embodiment of the present invention. According to one embodiment of the present invention, a highly reliable lighting device having a curved light-emitting portion can be provided with a high yield.

Figure 16F:
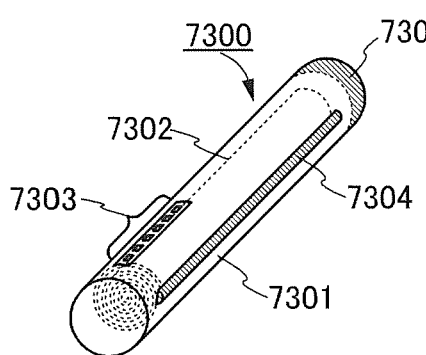

FIG. 16F illustrates an example of a portable input/output device. An input/output device 7300 includes a housing 7301, a display portion 7302, operation buttons 7303, a display portion pull 7304, and a control portion 7305.

The input/output device 7300 includes a rolled flexible display portion 7302 in the cylindrical housing 7301.

The input/output device 7300 can receive a video signal with the control portion 7305 and display the received video on the display portion 7302. The control portion 7305 includes a battery. Moreover, the control portion 7305 may include a terminal portion for connecting a connector so that a video signal or power can be directly supplied from the outside through a wire.

By pressing the operation buttons 7303, power on/off, switching of displayed video, and the like can be performed.

Figure 16G:
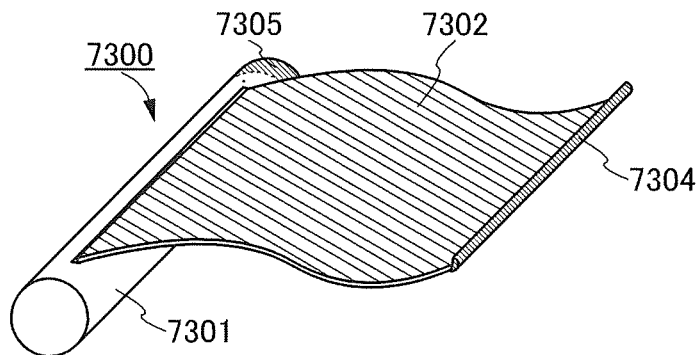

FIG. 16G illustrates the input/output device 7300 in a state where the display portion 7302 is pulled out with the display portion pull 7304. Video can be displayed on the display portion 7302 in this state. The operation buttons 7303 on the surface of the housing 7301 allow one-handed operation. The operation buttons 7303 are provided not in the center of the housing 7301 but on one side of the housing 7301 as illustrated in FIG. 16F, which makes one-handed operation easy.

A reinforcement frame may be provided for a side portion of the display portion 7302 so that the display portion 7302 has a flat display surface when pulled out.

Note that in addition to this structure, the housing may be provided with a speaker so that sound is output with an audio signal received together with a video signal.

The display portion 7302 includes the input/output device of one embodiment of the present invention. According to one embodiment of the present invention, a lightweight and highly reliable input/output device can be provided with a high yield.

Figure 17A:
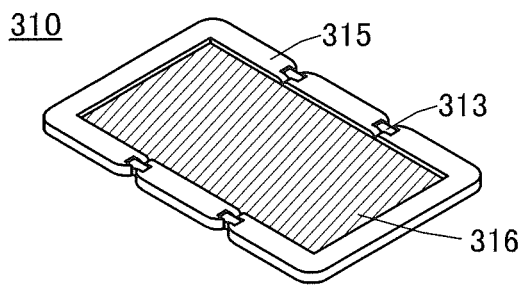
FIGS. 17A to 17I illustrate examples of electronic appliances.
Figure 17B:
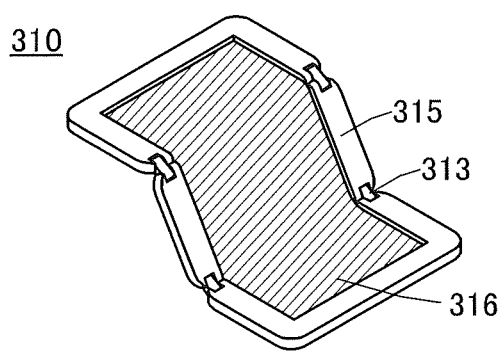
Figure 17C:
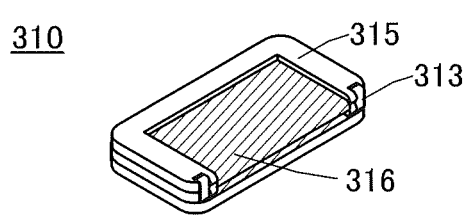

FIGS. 17A to 17C illustrate a foldable portable information terminal 310. FIG. 17A illustrates the portable information terminal 310 that is opened. FIG. 17B illustrates the portable information terminal 310 that is being opened or being folded. FIG. 17C illustrates the portable information terminal 310 that is folded. The portable information terminal 310 is highly portable when folded, and is highly browsable when opened because of a seamless large display area.

A display panel 316 is supported by three housings 315 joined together by hinges 313. By folding the portable information terminal 310 at a connection portion between two housings 315 with the hinges 313, the portable information terminal 310 can be reversibly changed in shape from an opened state to a folded state. The input/output device of one embodiment of the present invention can be used for the display panel 316. For example, it is possible to use a light-emitting device or an input/output device that can be bent with a radius of curvature of 1 mm or more and 150 mm or less.

In one embodiment of the present invention, a sensor that senses whether the input/output device is folded or opened and supplies sensing information may be provided. When obtaining information indicating that the input/output device is folded, a control portion of the input/output device may stop a folded portion (or a portion that is folded and cannot be seen by a user) from operating, specifically performing display or sensing by a touch sensor.

Similarly, the control portion of the input/output device may make display and sensing by a touch sensor restart when obtaining information indicating that the input/output device is opened.

Figure 17D:
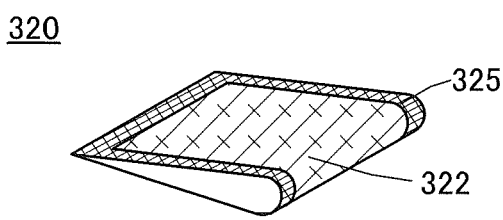
Figure 17E:
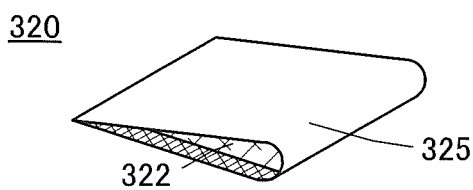

FIGS. 17D and 17E illustrate a foldable portable information terminal 320. FIG. 17D illustrates the portable information terminal 320 that is folded so that a display portion 322 is on the outside. FIG. 17E illustrates the portable information terminal 320 that is folded so that the display portion 322 is on the inside. When the portable information terminal 320 is not used, the portable information terminal 320 is folded so that a non-display portion 325 faces the outside, whereby the display portion 322 can be prevented from being contaminated or damaged. The light-emitting device or the input/output device of one embodiment of the present invention can be used for the display portion 322.

Figure 17F:
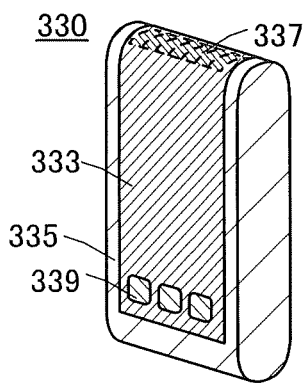
Figure 17G:
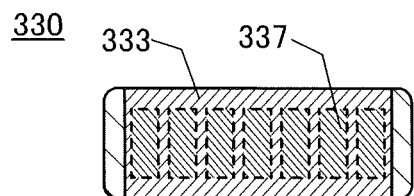
Figure 17H:
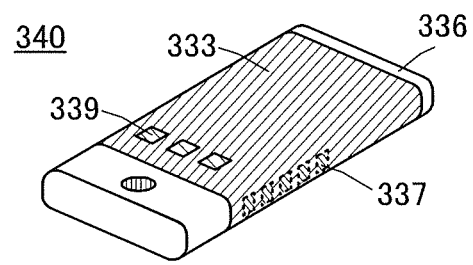

FIG. 17F is a perspective view illustrating the external shape of a portable information terminal 330. FIG. 17G is a top view of the portable information terminal 330. FIG. 17H is a perspective view illustrating the external shape of a portable information terminal 340.

The portable information terminals 330 and 340 function as one or more of a telephone set, an electronic notebook, and an information browsing system, for example. Specifically, each of the portable information terminals 330 and 340 can be used as a smartphone.

The portable information terminals 330 and 340 can display letters and image data on their plurality of surfaces. For example, three operation buttons 339 can be displayed on one surface (see FIGS. 17F and 17H). Moreover, information 337 indicated by dashed rectangles can be displayed on another surface (see FIGS. 17G and 17H). Examples of the information 337 include notification of a social networking service (SNS) message, display indicating reception of an email or an incoming call, the title or sender of an email or the like, the date, the time, remaining battery, and the reception strength of an antenna. Alternatively, the operation button 339, an icon, or the like may be displayed in place of the information 337. Although FIGS. 17F and 17G show the example in which the information 337 is displayed at the top, one embodiment of the present invention is not limited to this example. For instance, the information 337 may be displayed on the side as in the portable information terminal 340 in FIG. 17H.

For example, a user of the portable information terminal 330 can see the display (here, the information 337) with the portable information terminal 330 put in a breast pocket. Specifically, a caller's phone number, name, or the like of an incoming call is displayed in a position that can be seen from above the portable information terminal 330. Thus, the user can see the display without taking out the portable information terminal 330 from the pocket and decide whether to answer the call.

The input/output device of one embodiment of the present invention can be used for a display portion 333 included in a housing 335 of the portable information terminal 330 and a housing 336 of the portable information terminal 340. According to one embodiment of the present invention, a highly reliable portable information terminal having a curved display portion can be provided with a high yield.

Figure 17I:
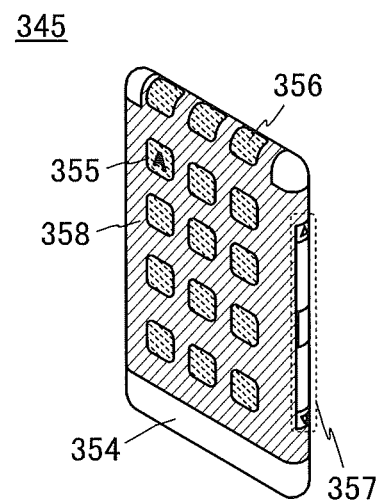

As in a portable information terminal 345 illustrated in FIG. 17I, information may be displayed on at least three surfaces. Here, as an example, information 355, information 356, and information 357 are displayed on different surfaces.

The input/output device of one embodiment of the present invention can be used for a display portion 358 included in a housing 354 of the portable information terminal 345. According to one embodiment of the present invention, a highly reliable portable information terminal having a curved display portion can be provided with a high yield.

This embodiment can be combined with any other embodiment as appropriate.

This application is based on Japanese Patent Application serial No. 2014-095116 filed with the Japan Patent Office on May 2, 2014, the entire contents of which are hereby incorporated by reference.

What is claimed is:

1. A display device comprising:
   a first flexible substrate;
   a first insulating layer over the first flexible substrate;
   a first transistor over the first insulating layer;
   a first conductive layer over the first insulating layer;
   a light-emitting element that is over and electrically connected to the first transistor and comprises an EL layer containing a light-emitting organic compound between a first electrode and a second electrode;
   a first bonding layer over the light-emitting element;
   a sensing element and a second transistor that are over the first bonding layer and electrically connected to each other;
   a second insulating layer over the sensing element and the second transistor;
   a first flexible printed circuit over the first flexible substrate; and
   a second flexible printed circuit electrically connected to the sensing element,
   wherein B/A is greater than or equal to 0.7 and less than or equal to 1.7, where A is a distance between the first insulating layer and the EL layer and B is a distance between the second insulating layer and the EL layer, and
   wherein the first flexible printed circuit is electrically connected to the first conductive layer through an opening in the second insulating layer and the first bonding layer.

2. The display device according to claim 1, wherein a thickness of the display device is greater than or equal to 1 µm and less than or equal to 100 µm.

3. The display device according to claim 1, wherein a thickness of the first bonding layer is greater than or equal to 50 nm and less than or equal to 10 µm.

4. The display device according to claim 1, further comprising a second flexible substrate over the second insulating layer.

5. The display device according to claim 1, further comprising a second bonding layer between the first flexible substrate and the first insulating layer,
wherein a thickness of the second bonding layer is greater than or equal to 50 nm and less than or equal to 10 µm.

6. The display device according to claim 5, wherein at least part of an edge of the second bonding layer is positioned outside an edge of the first flexible substrate.

7. The display device according to claim 4, further comprising a third bonding layer between the second flexible substrate and the second insulating layer,
wherein a thickness of the third bonding layer is greater than or equal to 50 nm and less than or equal to 10 µm.

8. The display device according to claim 7, wherein at least part of an edge of the third bonding layer is positioned outside an edge of the second flexible substrate.

9. The display device according to claim 1, further comprising a fourth bonding layer surrounding the first bonding layer.

10. An electronic appliance comprising the display device according to claim 1.

11. A display device comprising:
a first flexible substrate;
a first insulating layer over the first flexible substrate;
a first transistor over the first insulating layer;
a first conductive layer over the first insulating layer;
a light-emitting element that is over and electrically connected to the first transistor and comprises an EL layer containing a light-emitting organic compound between a first electrode and a second electrode;
a first bonding layer over the light-emitting element;
a sensing element and a second transistor that are over the first bonding layer and electrically connected to each other;
a second insulating layer over the sensing element and the second transistor;
a first flexible printed circuit over the first flexible substrate; and
a second flexible printed circuit electrically connected to the sensing element through a first opening in the first insulating layer and the first bonding layer,
wherein B/A is greater than or equal to 0.7 and less than or equal to 1.7, where A is a distance between the first insulating layer and the EL layer and B is a distance between the second insulating layer and the EL layer, and
wherein the first flexible printed circuit is electrically connected to the first conductive layer through a second opening in the second insulating layer and the first bonding layer.

12. The display device according to claim 11, wherein a thickness of the display device is greater than or equal to 1 µm and less than or equal to 100 µm.

13. The display device according to claim 11, wherein a thickness of the first bonding layer is greater than or equal to 50 nm and less than or equal to 10 µm.

14. The display device according to claim 11, further comprising a second flexible substrate over the second insulating layer.

15. The display device according to claim 11, further comprising a second bonding layer between the first flexible substrate and the first insulating layer,
wherein a thickness of the second bonding layer is greater than or equal to 50 nm and less than or equal to 10 µm.

16. The display device according to claim 15, wherein at least part of an edge of the second bonding layer is positioned outside an edge of the first flexible substrate.

17. The display device according to claim 14, further comprising a third bonding layer between the second flexible substrate and the second insulating layer,
wherein a thickness of the third bonding layer is greater than or equal to 50 nm and less than or equal to 10 µm.

18. The display device according to claim 17, wherein at least part of an edge of the third bonding layer is positioned outside an edge of the second flexible substrate.

19. The display device according to claim 11, further comprising a fourth bonding layer surrounding the first bonding layer.

20. An electronic appliance comprising the display device according to claim 11.

* * * * *